US012638720B2

(12) United States Patent
Pang et al.

(10) Patent No.: US 12,638,720 B2
(45) Date of Patent: May 26, 2026

(54) BACKLIGHT MODULE AND DISPLAY DEVICE

(71) Applicant: HISENSE VISUAL TECHNOLOGY CO., LTD., Qingdao (CN)

(72) Inventors: Zhenhua Pang, Qingdao (CN); Guangxue Liu, Qingdao (CN); Qiang Du, Qingdao (CN); Yuxin Zhang, Qingdao (CN); Botao Li, Qingdao (CN)

(73) Assignee: HISENSE VISUAL TECHNOLOGY CO., LTD., Qingdao (CN)

( * ) Notice: Subject to any disclaimer, the term of this patent is extended or adjusted under 35 U.S.C. 154(b) by 0 days.

(21) Appl. No.: 19/004,957

(22) Filed: Dec. 30, 2024

(65) Prior Publication Data

US 2026/0118718 A1     Apr. 30, 2026

Related U.S. Application Data

(63) Continuation of application No. 18/609,637, filed on Mar. 19, 2024, now Pat. No. 12,181,749, which is a
(Continued)

(30) Foreign Application Priority Data

| Nov. 26, 2021 | (CN) | .......................... 202111424817.8 |
| Dec. 24, 2021 | (CN) | .......................... 202123301293.1 |
| Apr. 15, 2022 | (CN) | .......................... 202220884311.9 |

(51) Int. Cl.
| *G02F 1/1335* | (2006.01) |
| *G02F 1/13357* | (2006.01) |
| *H05K 5/00* | (2006.01) |

(52) U.S. Cl.
CPC .. *G02F 1/133612* (2021.01); *G02F 1/133603* (2013.01); *G02F 1/133615* (2013.01); *H05K 5/0069* (2013.01); *H05K 5/0082* (2013.01)

(58) Field of Classification Search
CPC ........ G02F 1/133612; G02F 1/133603; H05K 5/0069
See application file for complete search history.

(56) References Cited

U.S. PATENT DOCUMENTS

| 2003/0171883 A1 | 9/2003 | Tseng |
| 2019/0206333 A1 | 7/2019 | Kim et al. |
| 2022/0326573 A1* | 10/2022 | Tong ................. G02F 1/133604 |

FOREIGN PATENT DOCUMENTS

| CN | 1801265 A | 7/2006 |
| CN | 201307949 Y | 9/2009 |
(Continued)

*Primary Examiner* — Sean P Gramling
(74) *Attorney, Agent, or Firm* — Meunier Carlin & Curfman LLC

(57)     ABSTRACT

A backlight module and a display apparatus are disclosed. The backlight module includes a circuit board, a driving chip on the circuit board, and a plurality of light-emitting areas corresponding to the driving chip. The driving chip includes a first pin and a third pin located on a first side of the driving chip, and a second pin and a fourth pin located on a second side of the driving chip, the first pin and the second pin are electrically connected inside the driving chip, and the third pin and the fourth pin are electrically connected inside the driving chip; the first side and the second side are opposite sides. The driving chip further includes a plurality of control terminals on a third side of the driving chip, the plurality of control terminals are correspondingly connected with the plurality of light-emitting areas.

37 Claims, 22 Drawing Sheets

Related U.S. Application Data continuation of application No. PCT/CN2022/112601, filed on Aug. 15, 2022.

(56) References Cited

FOREIGN PATENT DOCUMENTS

| CN | 108761904 | A | 11/2018 |
|----|-----------|---|---------|
| CN | 109994071 | A | 7/2019 |
| CN | 110415641 | A | 11/2019 |
| CN | 213987118 | U | 8/2021 |
| JP | 2001175222 | A | 6/2001 |
| KR | 1020120036661 | | 4/2012 |
| KR | 1020120061292 | | 6/2012 |

* cited by examiner

Backlight driving module 010

Backlight driving module 010

—— Signal line

---------- Ground line

Substrate 0121

Second
terminal

Substrate 0121

Second
terminal

0010

0010

0010

0010

BACKLIGHT MODULE AND DISPLAY DEVICE

CROSS-REFERENCE TO RELATED APPLICATIONS

This application is a continuation application of U.S. patent application Ser. No. 18/609,637, filed Mar. 19, 2024. The U.S. patent application Ser. No. 18/609,637 is a continuation application of International Application No. PCT/CN2022/112601, filed on Aug. 15, 2022, which claims priorities to Chinese Patent Application No. 202111424817.8, filed on Nov. 26, 2021; Chinese Patent Application No. 202123301293.1, filed on Dec. 24, 2021; and Chinese Patent Application No. 202220884311.9, filed on Apr. 15, 2022, all of which are hereby incorporated by reference in their entireties.

TECHNICAL FIELD

The present disclosure relates to the field of electronic technology, and particularly to a backlight module and a display apparatus.

BACKGROUND

A display apparatus generally includes a lamp board with a plurality of light-emitting areas and a driving board for driving the plurality of light-emitting areas to emit light. In the display apparatus, the driving board and the lamp board carrying the plurality of light-emitting areas in the display apparatus can be set on a same single-sided circuit board, realizing integration of the driving board and the lamp board.

SUMMARY

Embodiments of the present disclosure provide a backlight module, including: a circuit board; a driving chip on the circuit board; and a plurality of light-emitting areas corresponding to the driving chip; where the driving chip includes a first pin and a third pin located on a first side of the driving chip, and a second pin and a fourth pin located on a second side of the driving chip; where the first pin and the second pin are electrically connected inside the driving chip, and the third pin and the fourth pin are electrically connected inside the driving chip; the first side and the second side are opposite sides; the driving chip further includes a plurality of control terminals on a third side of the driving chip; where the plurality of control terminals are correspondingly connected with the plurality of light-emitting areas.

The present disclosure provides a display apparatus, including: the backlight module according to the first aspect, a main board, and a power supply; where the power supply is connected with the backlight module and the main board, and is configured to provide a power supply signal; the main board is connected with the backlight module, and is configured to send a control signal and a clock signal to the backlight module, so that the backlight module emits light based on the clock signal and the control signal.

DETAILED DESCRIPTION

When the following description refers to drawings, the same reference number in different drawings indicates same or similar elements, unless otherwise indicated. Embodiments described in the following embodiments are not intended to represent all embodiments consistent with the present disclosure. On the contrary, the embodiments are merely examples of apparatuses and methods consistent with some aspects of the present disclosure as detailed in the appended claims.

Figure 1:
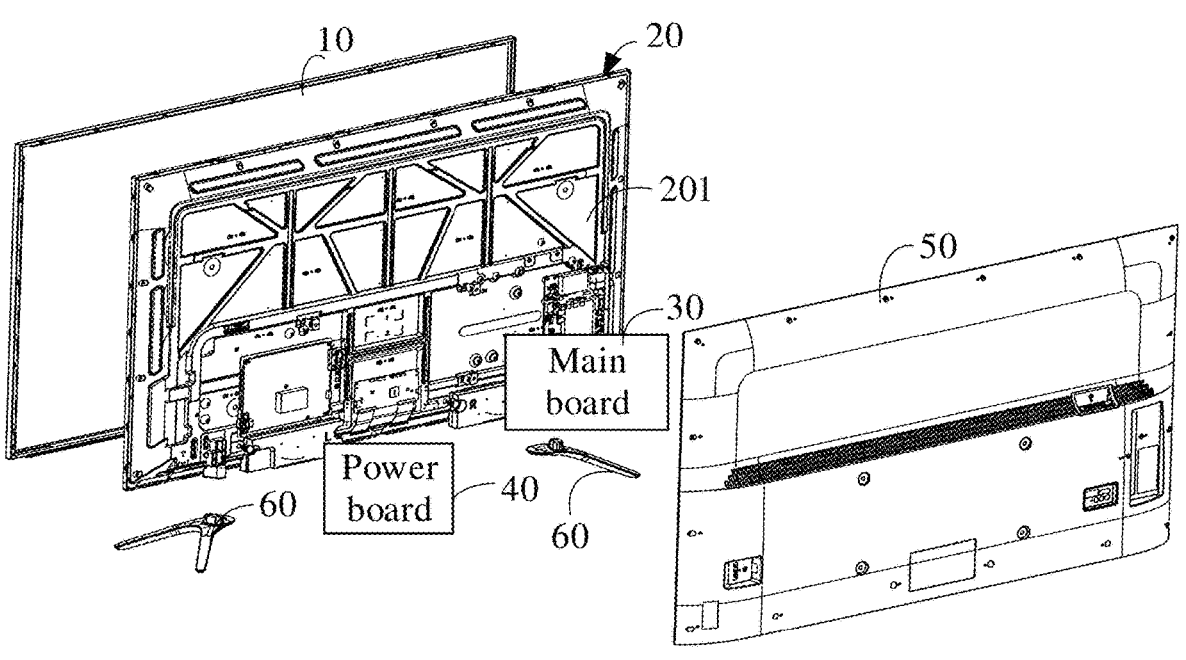
FIG. 1 is a schematic structural diagram of a display apparatus according to embodiments of the present disclosure.

FIG. 1 is a schematic structural diagram of a display apparatus according to embodiments of the present disclosure. The display apparatus includes a panel 10, a backlight component 20, a main board 30, a power board 40, a rear housing 50, and a base 60. The panel 10 is configured to present an image to a user. The backlight component 20 is located below the panel 10 and is typically an optical component for providing sufficient brightness and a uniformly distributed light source, so that the panel 10 can display images normally. The backlight component 20 further includes a backplane 201. The main board 30 and the power board 40 are disposed on the backplane 201. Generally, some convex structures are formed on the backplane 201 by stamping, and the main board 30 and the power board 40 are fixed on the convex structures by screws or hooks. The rear housing 50 covers the panel 10 to hide components of the display apparatus such as the backlight component 20, the main board 30, and the power board 40. The base 60 is configured to support the display apparatus.

In some embodiments, the display apparatus further includes a driving board. The power board is configured to supply power to the driving board, the backlight component and the main board. The main board is configured to receive an image signal transmitted from an external server or an optical fiber, generate a driving signal by processing the image signal and send the driving signal to the driving board, so that the driving board drives the backlight component to emit light.

In some embodiments, as a size of a display panel in the display apparatus increases, generally the backlight component in the display apparatus is divided into a plurality of light-emitting areas, and the image display is realized through a multi-subarea dimming method.

In some embodiments, the backlight component and the driving board may be disposed on the same single panel, that is, an integrated lamp driving design is adopted.

Figure 2:
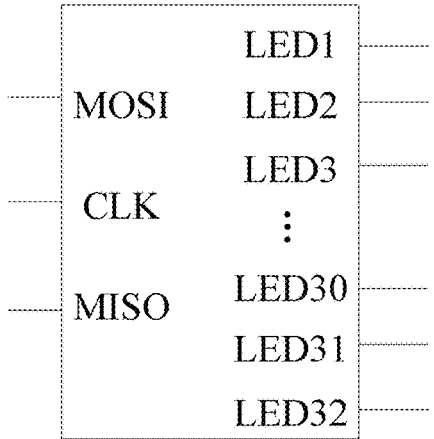
FIG. 2 is a schematic design diagram of a driving chip according to embodiments of the present disclosure.
Figure 3:
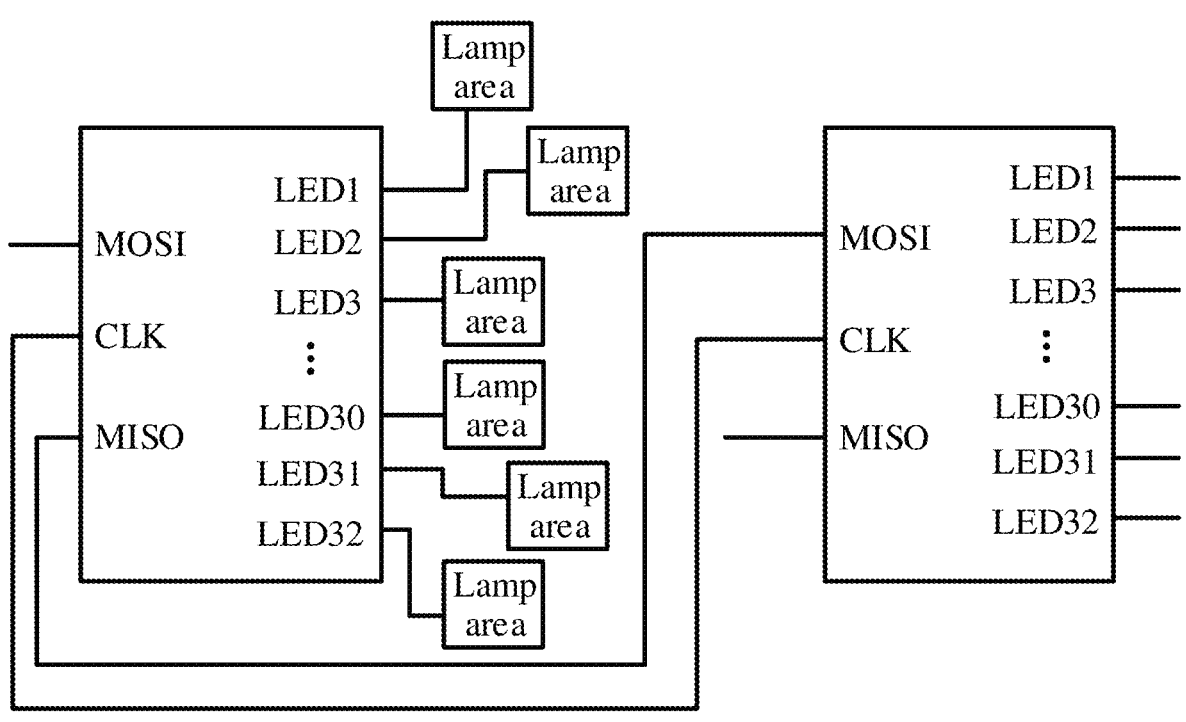
FIG. 3 is a schematic diagram of cascade of driving chips according to embodiments of the present disclosure.

FIG. 2 is a schematic design diagram of a driving chip according to embodiments of the present disclosure. The driving chip in the figure is configured to receive a driving signal sent from the main board and control the backlight component to emit light according to the driving signal. In some examples, the drive signal includes a control signal and a clock signal. As shown in FIG. 2, the driving chip includes two data signal interfaces (marked by MOSI and MISO in the figure) and a clock signal interface (Marked by CLK in the figure) on a left side of the chip, and 32 light-emitting area terminals (marked by LEDn in the figure, where n is an integer in a range of 1 to 32) are on a right side of the driving chip. In the figure, MOSI and CLK are respectively configured to receive a control signal and a clock signal for driving the light-emitting areas. The LEDs 1-32 are respectively configured to be connected with corresponding light-emitting areas. The MISO may output a control signal as an input signal to the MOSI interface in a next driving chip. When a quantity of subareas of the light-emitting areas in the display apparatus is large, and a quantity of light-emitting areas of a single driving chip shown in FIG. 2 is insufficient, theoretically, data signal interfaces and clock signal interfaces of a plurality of driving chips can be connected respectively, namely, connected as shown in FIG. 3. FIG. 3 is a schematic diagram of cascade of driving chips according to embodiments of the present disclosure (it should be noted that, the light-emitting areas described in embodiments of the present disclosure may also be referred to as lamp areas, that is, the lamp areas as shown in FIGS. 3 to 8 and 11 to 12 are the light-emitting areas). When an integrated lamp driving scheme is implemented on a single panel, cascade of driving chips may be accomplished by connecting a lead of the MISO interface of the current chip with the MOSI interface of another driving chip by bypassing a layout of the light-emitting areas on the right side of the chip, and a connecting line at the CLK input port of the current chip is also need to be connected with a CLK port of a next driving chip, so as to match with the quantity of the light-emitting areas in the display apparatus. But when the cascade connection of the driving chips is performed on an actual single panel, because a connecting line for transmitting a signal is required to be designed between a single driving chip and a single light-emitting area, and the quantity of the light-emitting areas driven by the driving chip is large, when designing connecting lines between the data signal interfaces and the connecting lines between the clock signal interfaces when the driving chips are cascaded, it is necessary to consider bypassing the connection between the driving chip and the light-emitting area and the space of the light-emitting area, resulting in complex layout and wiring on the single-panel circuit board.

In view of the above issues, the present disclosure provides a backlight module and a display apparatus. The backlight module includes a circuit board, a driving chip on the circuit board, and a plurality of light-emitting areas corresponding to the driving chip. The driving chip includes a first pin and a third pin located on a first side of the driving chip, and a second pin and a fourth pin located on a second side of the driving chip. The first pin and the second pin are electrically connected inside the driving chip, and the third pin and the fourth pin are electrically connected inside the driving chip. The driving chip further includes a plurality of control terminals on a third side of the driving chip, and the plurality of control terminals are correspondingly connected with the plurality of light-emitting areas. Based on the design of the driving chip, when a plurality of driving chips are cascaded, there is no need to bypass connecting lines of the light-emitting areas connected with the driving chip, and thus the wiring complexity of cascading a plurality of driving chips when the backlight module with integrated lamp driving on a single panel is reduced.

Figure 4:
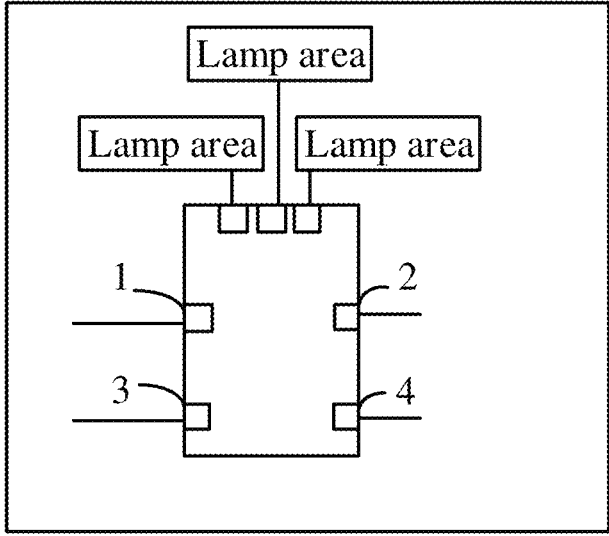
FIG. 4 is a schematic structural diagram of a backlight module according to embodiments of the present disclosure.

FIG. 4 is a schematic structural diagram of a backlight module according to embodiments of the present disclosure. The display apparatus includes a circuit board, a driving chip on the circuit board, and a plurality of light-emitting areas corresponding to the driving chip.

The pins in the driving chip IC in the embodiments are configured to receive and transmit a control signal or a clock signal sent by the main board. As shown in the figure, the driving chip in the embodiments includes a first pin 1 and a third pin 3 on a first side, and a second pin 2 and a fourth pin 4 on a second side. The first pin 1 and the second pin 2 are electrically connected inside the driving chip, and the third pin 3 and the fourth pin 4 are electrically connected inside the driving chip.

As shown in FIG. 4, in order to avoid that driving chips need to bypass a plurality of light-emitting areas when being cascaded, in the embodiments, when designing the interfaces of the driving chip, the pins for transmitting the control signal and the clock signal may be located on the first side and the second side opposite to the first side of the driving chip, and control terminals for connecting the light-emitting areas are disposed on the third side of the driving chip. As shown in the figure, for example, the first pin 1 in the driving chip is configured to transmit the control signal, and the third pin 3 is configured to transmit the clock signal. In order to facilitate the wiring on the circuit board, when designing the pins of the driving chip, it can be considered that the first pin 1 and the second pin 2 for transmitting the control signal are respectively on two sides of the driving chip, and the first pin 1 and the second pin 2 are electrically connected inside the driving chip. For example, in an example, it can be noted that two leads are arranged at control signal interfaces of an internal circuit of the driving chip. An end of one lead of the two leads forms a first pin 1 of the driving chip and is led out from the first side of the driving chip; an end of the other lead of the two leads forms the second pin 2 of the driving chip and is led out from the second side of the driving chip.

Similarly, the third pin 3 and the fourth pin 4 in the driving chip for transmitting the clock signal are also on the first side and the second side of the driving chip respectively, and the third pin 3 and the fourth pin 4 are electrically connected inside the driving chip.

In addition, the driving chip further includes control terminals for connecting the light-emitting areas (three control terminals are provided in the figure, and are connected with three light-emitting areas correspondingly), and the control terminals are on the third side of the driving chip, that is, the control terminals are not on the same side as the first pin 1 and the second pin 2. In this way, when a plurality of driving chips need to be cascaded subsequently, wiring can be performed by connecting the pins on the first side and the second side of the driving chips, without the need to bypass the light-emitting areas of the third side.

Figure 5:
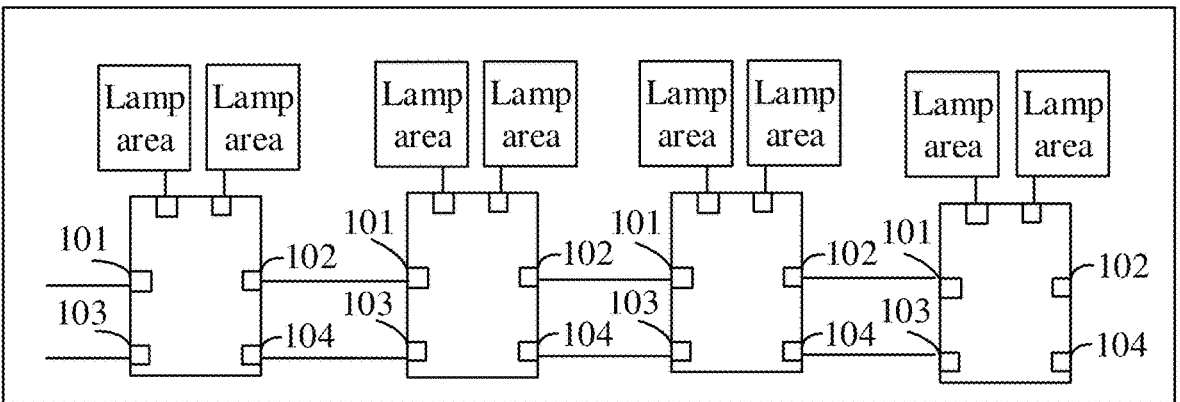
FIG. 5 is a schematic structural diagram of cascade of driving chips according to embodiments of the present disclosure.

FIG. 5 is a schematic structural diagram of first kind of cascade of driving chips according to embodiments of the present disclosure, in which driving chips arranged in a row are provided. In the figure, the row includes four driving chips, and each of the driving chips includes two control terminals. The two control terminals are respectively connected with two light-emitting areas. The first pin 1 and the third pin 3 on the first side of the first driving chip in the row are respectively configured to receive a control signal and a clock signal from outside (for example, a main board) of the circuit board. The first pin 1 and the third pin 3 of another driving chip in the row are respectively connected with the second pin 2 and the fourth pin 4 of a preceding driving chip.

When the backlight module is required to work, after the first driving chip in the row receives the control signal and the clock signal input from the main board through the first pin 1 and the third pin 3 respectively, control signals and the clock signals corresponding to respective light-emitting areas can be determined from the control signal and the clock signal according to identifiers of the light-emitting areas connected with the driving chip, to drive each of the light-emitting areas to emit light. The control signal and the clock signal of the first driving chip input from the main board can further pass through the second pin and the fourth pin of the first driving chip, the second pin and the fourth pin of the first driving chip respectively output control signals and clock signals for controlling remaining light-emitting areas in the row, the control signals and the clock signals are respectively output to the first pin and the third pin of the second driving chip connected with the second pin and the fourth pin of the first driving chip, and then sequentially transmitted to each driving chip so as to enable the light-emitting areas corresponding to each driving chip to emit light.

In the embodiments, based on the design of the pins of the driving chip, when a plurality of driving chips are cascaded, corresponding pins for transmitting the clock signal and the control signal can be directly connected, and connection of the pins does not need to bypass connecting lines of the light-emitting areas connected with the driving chip, thus the wiring complexity of cascading the driving chips when the integrated lamp driving design is implemented on a single panel is reduced.

On the basis of the design of the pins of the driving chip in the above embodiments, when a plurality of driving chips arranged in an array are on the circuit board, a first pin 1 and a second pin 2 between adjacent driving chips among the plurality of driving chips in a same row are connected in series, a third pin 3 and a fourth pin 4 between adjacent driving chips among the plurality of driving chips in the same row are connected in series. For last driving chips ranked last in different rows, second pins 2 of the last driving chips in adjacent rows are connected, and fourth pins 4 of the last driving chips in the adjacent rows are connected. The second pins 2 of the last driving chips are connected by a jumper wire, or the fourth pins 4 of the last driving chips are connected by a jumper wire. For first driving chips ranked first in different rows, first pins 1 of the first driving chips in adjacent rows are connected, and third pins 3 of the first driving chips in the adjacent rows are connected; the first pins 1 of the first driving chips are connected by a jumper wire, or the third pins 3 of the first driving chips are connected by a jumper wire.

Figure 6:
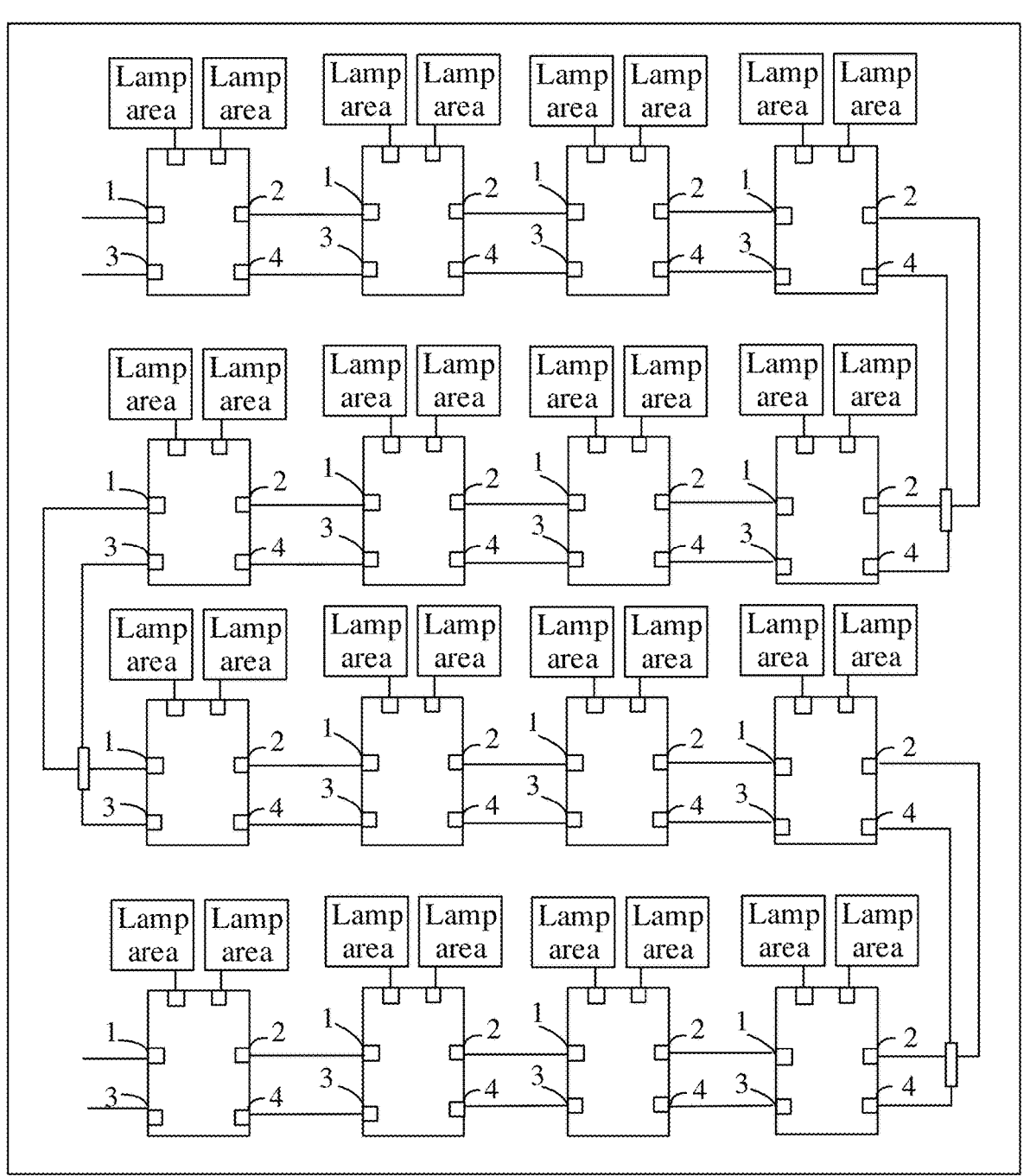
FIG. 6 is a schematic structural diagram of cascade of driving chips according to embodiments of the present disclosure.

FIG. 6 is a schematic structural diagram of second kind of cascade of driving chips according to embodiments of the present disclosure. In the figure, taking 16 driving chips arranged in an array as an example, each of the driving chips includes two control terminals on a third side, for driving corresponding light-emitting areas. When connecting the driving chips arranged in the array, for the driving chips in the same row, the first pin 1 and the second pin 2 between adjacent driving chips are connected, and the third pin 3 and the fourth pin 4 between adjacent driving chips are connected. When connecting the driving chips in different rows, for two driving chips at the end of their respective rows, second pins 2 of the two chips are correspondingly connected, and fourth pin 4 of the two chips are correspondingly connected. In addition, when wiring is carried out on the circuit board, a connecting line between the second pins 2 and a connecting line between the fourth pins 4 of the two driving chips are crossed and overlapped, a jumper wire connection can be used at an intersection of the two connecting lines.

Similarly, when connecting first driving chips ranked first in different rows, first pins 1 of the first driving chips in adjacent rows are connected, and third pins 3 of the first driving chips in the adjacent rows are connected. Moreover, when wiring is carried out on the circuit board, a connecting line between the first pins 1 and a connecting line between the third pins 3 of the two driving chips are crossed and overlapped, a jumper wire connection can be used at an intersection of the two connecting lines, to avoid the problem of overlapping of wiring on the circuit board.

When a jumper wire connection is used on the circuit board to avoid overlapping of wiring, overlapping of wiring can be avoided by setting a jumper wire. For example, for an overlapping point of two connecting lines on a circuit board, a connecting line may be wired directly on the circuit board, and the other connecting line can cross over the overlapping point through a connecting line such as a conducting wire and the like at the overlapping point, avoiding overlapping of wiring. In some examples, for the jumper wire connection, the connecting line for the jumper may also be replaced with a jumper resistor.

For example, the first pin 1 and the second pin 2 transmit a control signal, and the third pin 3 and the fourth pin 4 transmit a clock signal. When connecting the last driving chip in the first row and the last driving chip in the second row shown in FIG. 6, the connecting line between the fourth pins 4 for transmitting the clock signal is directly disposed on the circuit board, and the connecting line between the second pins 2 for transmitting the control signal adopts a jumper resistor at an intersection point of the two connecting lines, to cross over the overlapping point. Similarly, for the first driving chips of the second row and the third row, a connecting line between the third pins 3 is directly wired on the circuit board, and a connecting line between the first pins 1 adopts a jumper resistor at an overlapping point of the two connecting lines.

Figure 7:
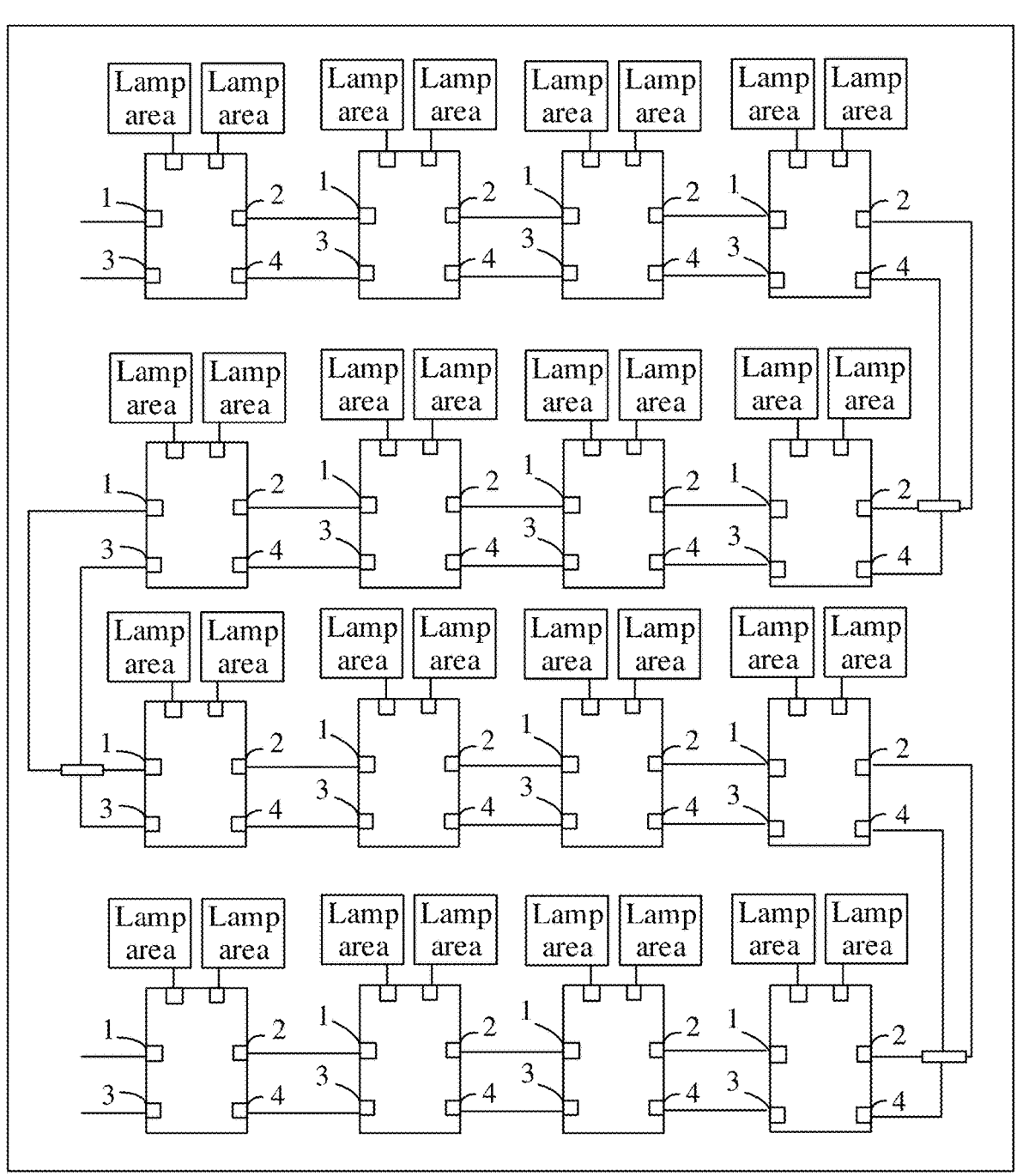
FIG. 7 is a schematic structural diagram of cascade of driving chips according to embodiments of the present disclosure.

FIG. 7 is a schematic structural diagram of third kind of cascade of driving chips according to embodiments of the present disclosure. Compared with FIG. 6, in FIG. 7, when connecting pins of last driving chips ranked last in different rows, a jumper wire is configured to connect a connecting line between the fourth pins 4 for transmitting the clock signal. When connecting pins of first driving chip in different rows, a jumper wire is configured to connect a connecting line between the third pins 3 for transmitting the control signal.

In some embodiments, when connecting pins of driving chips in different rows in the backlight module, a connecting line between any set of pins can be randomly selected for the jumper connection, regardless of the signal transmitted on the pins.

In the embodiments, when more light-emitting areas are required to be driven, a plurality of driving chips can also be arranged in an array, and when connecting pins of driving chips in different rows, a jumper wire connection needs to be carried out at an overlapping point when the pins of the driving chip in different rows are connected, avoiding overlapping of wiring on the circuit board. In the embodiments, based on the pin arrangement of the driving chips according to embodiments of the present disclosure, when the driving chips are arranged in an array, the operation complexity of wiring for transmitting control signals and clock signals between the driving chips by bypassing a plurality of light-emitting areas can be reduced.

Figure 8:
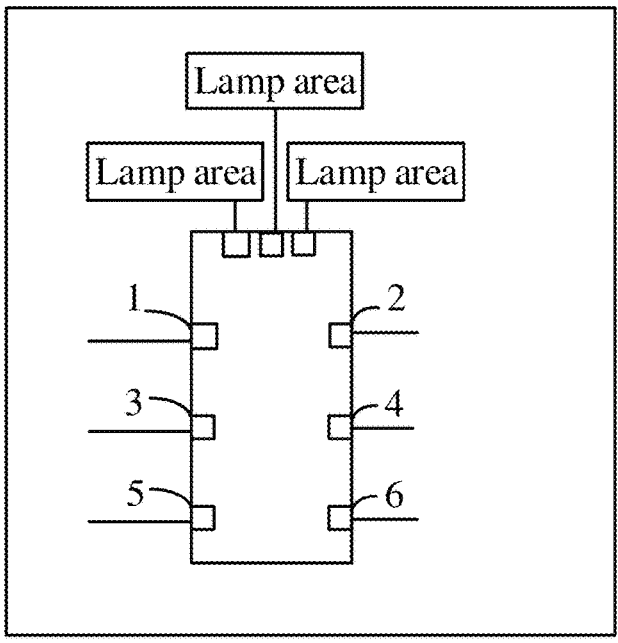
FIG. 8 is a schematic structural diagram of another backlight module according to embodiments of the present disclosure.

FIG. 8 is a schematic structural diagram of another backlight module according to embodiments of the present disclosure. On the basis of the pin arrangement of the driving chip shown in FIG. 4, the driving chip in the embodiments further includes a fifth pin 5 and a sixth pin 6. The first pin 1, the third pin 3, and the fifth pin 5 are sequentially arranged on the first side of the driving chip; and the second pin 2, the fourth pin 4, and the sixth pin 6 are sequentially arranged on the second side of the driving chip. The first pin 1, the second pin 2, the fifth pin 5, and the sixth pin 6 are electrically connected inside the driving chip.

As shown in FIG. 8, the driving chip in the backlight module in the embodiments includes the first pin 1, the second pin 2, the third pin 3, the fourth pin 4, the fifth pin 5 and the sixth pin 6. The first pin 1, the second pin 2, the fifth pin 5 and the sixth pin 6 are electrically connected inside the driving chip, for transmitting the same kind of signal. The third pin 3 and the fourth pin 4 are electrically connected inside the driving chip for transmitting the same kind of signal. In addition, when arranging the pins, the first pin 1, the third pin 3 and the fifth pin 5 are sequentially arranged on the first side of the driving chip, that is, the third pin 3 for transmitting another kind of signal is between the first pin 1 and the fifth pin 5 for transmitting the same kind of signal. Similarly, the second pin 2, the fourth pin 4 and the sixth pin 6 are arranged on the second side of the driving in order, that is, the fourth pin 4 for transmitting another kind of signal is between the second pin 2 and the sixth pin 6 for transmitting the same kind of signal.

In some embodiments, the first pin 1, the second pin 2, the fifth pin 5, and the sixth pin 6 are configured to transmit a control signal of a light-emitting area in the backlight module; the third pin 3 and the fourth pin 4 are configured to transmit a clock signal of a light-emitting area in the backlight module.

Figure 9:
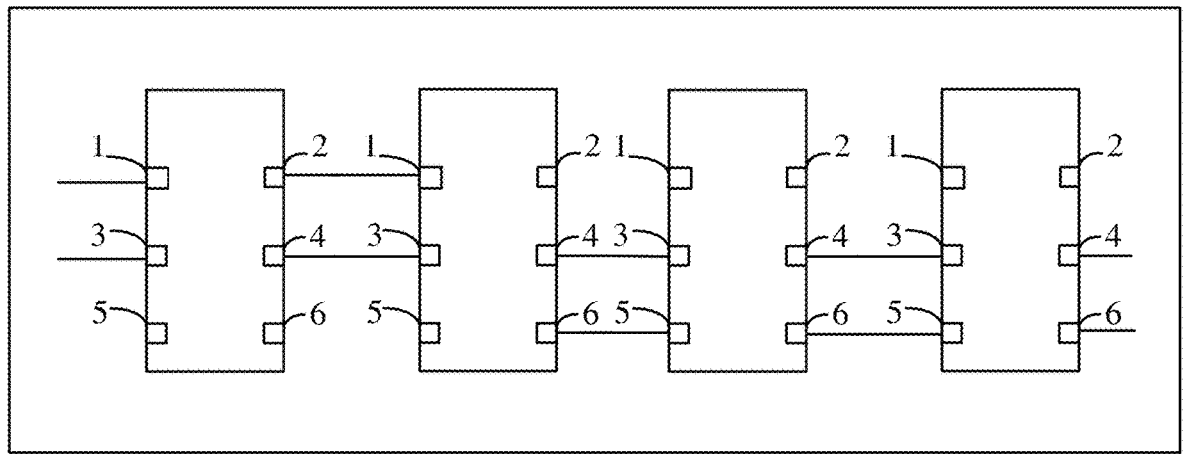
FIG. 9 is a schematic structural diagram of fourth kind of cascade of driving chips according to embodiments of the present disclosure.

When driving chips in the embodiments are cascaded on the circuit board, the driving chips may be arranged as shown in FIG. 9. FIG. 9 is a schematic structural diagram of fourth kind of cascade of driving chips according to embodiments of the present disclosure. When a plurality of driving chips are arranged in a row, the third pin 3 of the first driving chip in the row may be configured to receive a clock signal input from outside, the first pin 1 or the fifth pin 5 of the first driving chip is configured to receive a control signal input from outside, and the third pin 3 of any one of remaining driving chips in the row is connected with the fourth pin 4 of a preceding driving chip for transmitting a clock signal. When transmitting a control signal, a connection relationship between the driving chips in the row may be that the first pin 1 of a driving chip is connected with the second pin 2 of a preceding driving chip, or the fifth pin 5 of the driving chip is connected with the sixth pin 6 of the preceding driving chip. The control terminal of the third side of the driving chip and the light-emitting area are not shown in the figure.

According to the pin design of the driving chip in the backlight module according to embodiments of the present disclosure, when a plurality of driving chips are cascaded in rows, the wiring design of connecting lines for transmitting the clock signal and the control signal between the driving chips on the circuit board does not need to bypass connecting lines between light-emitting areas on the third side of the driving chip and the driving chip, and thus the problem that the wire design is complex when the driving chips on the circuit board are cascaded in the related technology is avoid.

In some embodiments, based on the pin design of the driving chip in the backlight module of FIG. 8, when a plurality of driving chips arranged in an array are required to be on a circuit board, when connecting a plurality of driving chips in a same row, a third pin 3 and a fourth pin 4 between adjacent driving chips among the plurality of driving chips in the same row are connected in series; a first pin 1 and a second pin 2 between adjacent driving chips among the plurality of driving chips in the same row are connected in series, or a fifth pin 5 and a sixth pin 6 between adjacent driving chips among the plurality of driving chips in the same row are connected in series. When connecting last driving chips ranked last in different rows, fourth pins 4 of the last driving chips in adjacent rows are connected, a second pin 2 and a sixth pin 6 of the last driving chips in the adjacent rows are connected. When connecting first driving chips ranked first in different rows, third pins 3 of the first driving chips in adjacent rows are connected, and a first pin 1 and a fifth pin 5 of the first driving chips in the adjacent rows are connected.

Figure 10:
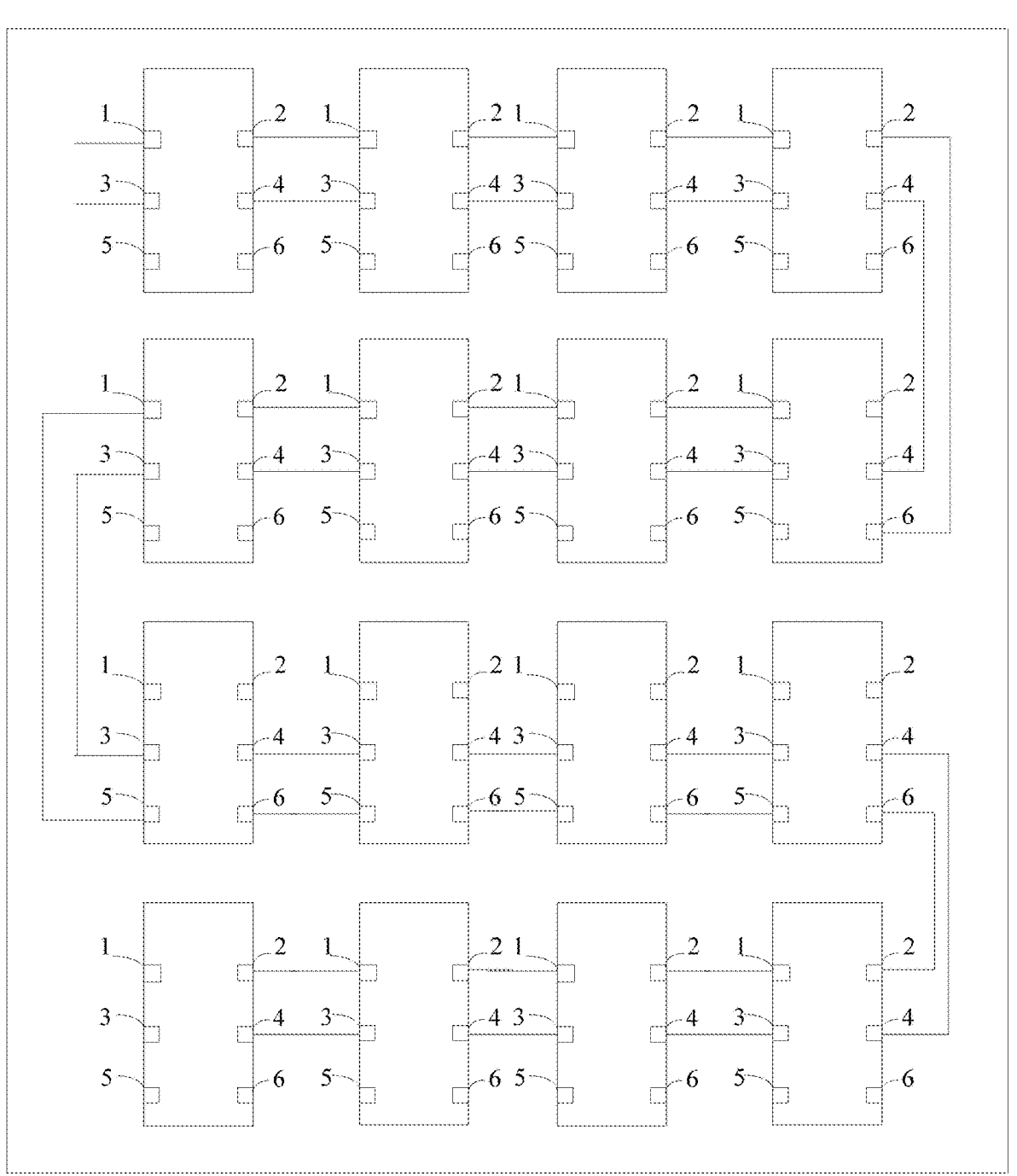
FIG. 10 is a schematic structural diagram of fifth kind of cascade of driving chips according to embodiments of the present disclosure.

FIG. 10 is a schematic structural diagram of fifth kind of cascade of driving chips according to embodiments of the present disclosure. There are 16 driving chips in the figure. When connecting the driving chips arranged in the array, for the driving chips in the same row, the third pin 3 and the fourth pin 4 between adjacent driving chips are still connected for transmitting a type of signal (e.g., a clock signal), and the first pin 1 and the second pin 2 between adjacent driving chips are connected, or the fifth pin 5 and the sixth pin 6 between adjacent driving chips are connected, for transmitting another type of signal (e.g., a control signal).

When connecting the driving chips in different rows, for two driving chips at the end of their respective rows, in order to avoid overlapping between connecting lines for the pins of the two driving chips, on the basis that the fourth pins 4 of the two driving chips are connected, it can be noted that the second pin 2 of one of the two driving chips is connected with the sixth pin 6 of the other driving chip, or the sixth pin 6 of one of the two driving chips is connected with the second pin 2 of the other driving chip, so that the connecting lines for the connected driving chips do not cross and overlap on the circuit board.

Similarly, when connecting first driving chips ranked first in different rows, in order to avoid overlapping between connecting lines for the pins of the two driving chips, on the basis that the third pins 3 of the two driving chips are connected, it can be noted that the first pin 1 of one of the two driving chips is connected with the fifth pin 5 of the other driving chip, or the fifth pin 5 of one of the two driving chips is connected with the first pin 1 of the other driving chip, so that the connecting lines for the connected driving chips do not cross and overlap on the circuit board.

In the embodiments, when the driving chip shown in FIG. 8 is adopted, and a plurality of driving chips arranged in an array are on the circuit board that is, when the driving chips are cascaded across rows, corresponding pins for transmitting the same signal can be directly connected, and there will be no overlapping of connecting lines that require a jumper wire connection, avoiding the problem of a high temperature of a jumper resistor during connection, which can easily cause a reflective plate above a light-emitting area in the backlight module to bulge and affect an adjustment effect of the reflective plate on a direction of light in the light-emitting area.

In some embodiments, when connecting a light-emitting area with a driving chip, in a feasible implementation, an end of the light-emitting area can be connected with the driving chip through a wire on the circuit board, the other end of the light-emitting area can also be directly connected with the driving chip through a wire on the circuit board, so that a conductive loop is formed for the driving chip and the light-emitting area.

In some embodiments, the plurality of control terminals on the third side of the driving chip include a common terminal and a plurality of output terminals; an end of the plurality of light-emitting areas corresponding to the driving chip is connected with the common terminal of the driving chip, and other ends of the light-emitting areas corresponding to the driving chip are respectively connected with the plurality of output terminals of the driving chip.

The driving chip in the embodiments can correspond to a plurality of light-emitting areas, and when connecting the driving chip with the plurality of light-emitting areas, the plurality of control terminals on the third side of the driving chip include a common terminal and a plurality of output terminals. The plurality of output terminals are in one-to-one correspondence with the plurality of light-emitting areas, other ends of the plurality of light-emitting areas are connected with control terminals corresponding thereto. The common terminal of the plurality of control terminals is used as a common terminal of the plurality of light-emitting areas, and an end of the plurality of light-emitting areas is connected with the common terminal. For each light-emitting area, a control terminal of the driving chip, the other end of the light-emitting area, an end of the light-emitting area and a common terminal of the driving chip form a conductive loop, so as to realize the control of the driving chip on the light-emitting area.

In the embodiments, the same common terminal may be used for the plurality of light-emitting areas for a single driving chip. In addition, the plurality of light-emitting areas in the embodiments may adopt a common anode connection or a common cathode connection. When the light-emitting areas adopt a common anode connection, an end of the light-emitting areas can be a positive common terminal, and then the positive common terminal of each of the light-emitting areas is connected with the common terminal of the corresponding driving chip. When the light-emitting areas adopt a common cathode connection, an end of the light-emitting areas can be used as a negative common terminal, and the negative common terminal of each of the light-emitting areas is connected with the common terminal of the corresponding driving chip.

In the embodiments, the control terminals on the third side of the driving chip include a common terminal, enabling an end of a plurality of light-emitting areas to be connected with the same common terminal, and other ends of the plurality of light-emitting areas to be connected with output terminals of the control terminals in one-to-one correspondence. Furthermore, through the above connection method, the arrangement of the pins in the driving chip can be simplified, and the connection is convenient.

In some embodiments, the driving chip further includes a plurality of control terminals on a fourth side of the driving chip; and the plurality of control terminals on the fourth side are correspondingly connected with the light-emitting areas.

Figure 11:
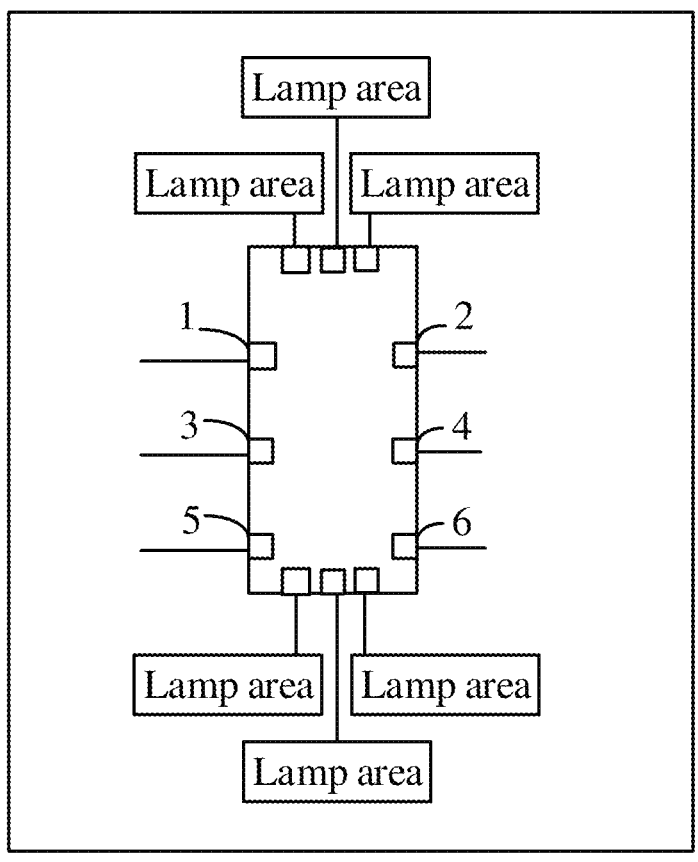
FIG. 11 is a schematic structural diagram of another backlight module according to embodiments of the present disclosure.

As shown in FIG. 11, FIG. 11 is a schematic structural diagram of another backlight module according to embodiments of the present disclosure. In the figure, the driving chip on the circuit board includes a first pin 1 and a third pin 3 on a first side, and a second pin 2 and a fourth pin 4. In addition, a third side and a fourth side of the driving chip respectively include a plurality of control terminals. In FIG. 11, three control terminals are on the third side of the driving chip, and three control terminals are on the fourth side of the driving chip. The six control terminals can be respectively connected with six corresponding light-emitting areas on the circuit board.

In the embodiments, the third side and the fourth side of the driving chip are both connected with a plurality of light-emitting areas, the quantity of light-emitting areas driven by the single driving chip is increased, and the arrangement of the light-emitting areas does not affect the connection between the driving chips when the driving chips are arranged in rows or arrays, that is, connection between driving chips does not need to bypass the light-emitting areas and connecting lines between the light-emitting areas and the driving chip.

Figure 12:
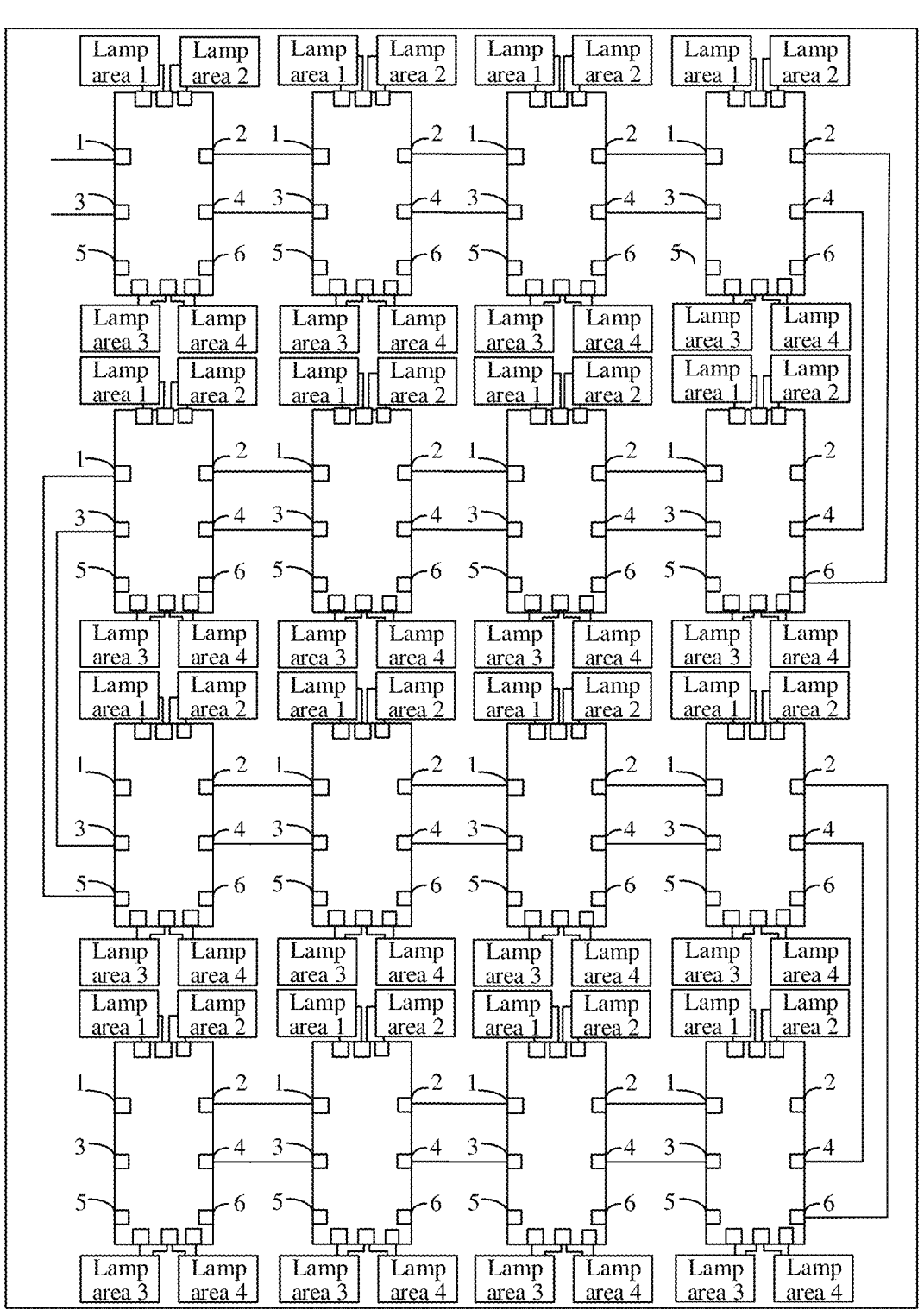
FIG. 12 is a schematic structural diagram of another backlight module according to embodiments of the present disclosure.

FIG. 12 is a schematic structural diagram of another backlight module according to embodiments of the present disclosure. The plurality of control terminals on the third side of the driving chip of the circuit board include a first common terminal, a first output terminal and a second output terminal. The plurality of control terminals on the fourth side of the driving chip include a second common terminal, a third output terminal and a fourth output terminal.

The driving chip is correspondingly connected with a first light-emitting area, a second light-emitting area, a third light-emitting area and a fourth light-emitting area. An end of the first light-emitting area and an end of the second light-emitting area are respectively connected with the first common terminal. The other end of the first light-emitting area is connected with the first output terminal, and the other end of the second light-emitting area is connected with the second output terminal. An end of the third light-emitting area and an end of the fourth light-emitting area are respectively connected with the second common terminal. The other end of the third light-emitting area is connected with the third output terminal, and the other end of the second light-emitting area is connected with the fourth output terminal.

As shown in FIG. 12, 16 driving chips are arranged in an array. In addition to six pins on the first side and the second side, each driving chip includes a first common terminal, a first output terminal and a second output terminal on the third side of the driving chip, and a second common terminal a third output terminal and a fourth output terminal on the fourth side of the driving chip. The first output terminal and the second output terminal on the third side of the driving chip are respectively connected with the other end of the first light-emitting area (the light-emitting area 1 in the figure) corresponding to the driving chip and the other end of the second light-emitting area (the light-emitting area 2 in the figure) corresponding to the driving chip, and the first common terminal on the third side of the driving chip is connected with an end of the first light-emitting area and an end of the second light-emitting area, forming a conductive path between the first light-emitting area and the driving chip and a conductive path between the second light-emitting area and the driving chip.

Similarly, the third output terminal and the fourth output terminal on the fourth side of the driving chip are respectively connected with the other end of the third light-emitting area (the light-emitting area 3 in the figure) corresponding to the driving chip and the other end of the fourth light-emitting area (the light-emitting area 4 in the figure) corresponding to the driving chip, and the second common terminal on the fourth side of the driving chip is connected with an end of the third light-emitting area and an end of the fourth light-emitting area, forming a conductive path between the third light-emitting area and the driving chip and a conductive path between the fourth light-emitting area and the driving chip.

In some embodiments, for the first common terminal and the second common terminal, in order to avoid that a connection between a light-emitting area and a common terminal needs to bypass other light-emitting areas when connecting the light-emitting area with the first common terminal or the second common terminal, the first common terminal may be between the first output terminal and the second output terminal, and the second common terminal may be between the third output terminal and the fourth output terminal, simplifying the wiring design on the circuit board.

In the backlight module in the embodiments, pins for transmitting the clock signal in the driving chip are respectively on the first side and the second side of the driving chip, pins for transmitting the control signal are also respectively on the first side and the second side of the driving chip, and the common terminal and the output terminal for connecting with the light-emitting areas are respectively on the third side and the fourth side of the driving chip, so that when cascading the driving chips, there is no need to bypass light-emitting areas connected with the driving chip and connecting lines between the driving chip and the light-emitting areas, which is convenient for the cascade of the driving chips. In addition, in the driving chip, the third side and the fourth side respectively include a first common terminal and a second common terminal, the first light-emitting area and the second light-emitting area are connected with the first common terminal on the third side, the third light-emitting area and the fourth light-emitting area are connected with second common terminal on the fourth side, the first common terminal may be between the first output terminal and the second output terminal, and the second common terminal may be between the third output terminal and the fourth output terminal, which facilitates connection between the light-emitting areas and the driving chip. Though the above arrangement, when the quantity of light-emitting areas divided is large, more driving chips can be cascaded to meet the requirements of the quantity of light-emitting areas.

The display apparatus according to embodiments of the present disclosure includes a backlight module in any one of above embodiments, a main board and a power supply. The power supply is connected with the backlight module and the main board and is configured to provide a power supply signal. The main board is connected with the backlight module and configured to send a control signal and a clock signal to the backlight module, so that the backlight module emits light based on the clock signal and the control signal.

In the related art, a display quality is generally improved by a multi-subarea local dimming technology of a television backlight, to meet a high requirement of a user on an image quality of a display screen.

In the multi-subarea local dimming technology, brightness of LED lamp groups in control subareas is accurately controlled by driving controllers, the LED lamp groups in each subarea are disposed on a lamp board, and lamp boards of subareas are spliced to form a backlight lamp board of a display apparatus. The driving controller corresponding to each LED lamp group is disposed on a single substrate, and then the substrate of the driving controller is attached on a back surface of the lamp board of the LED lamp group.

In this case, the cost of the substrate and the lamp board is large, resulting in a high cost of a backlight driving circuit.

Figure 13:
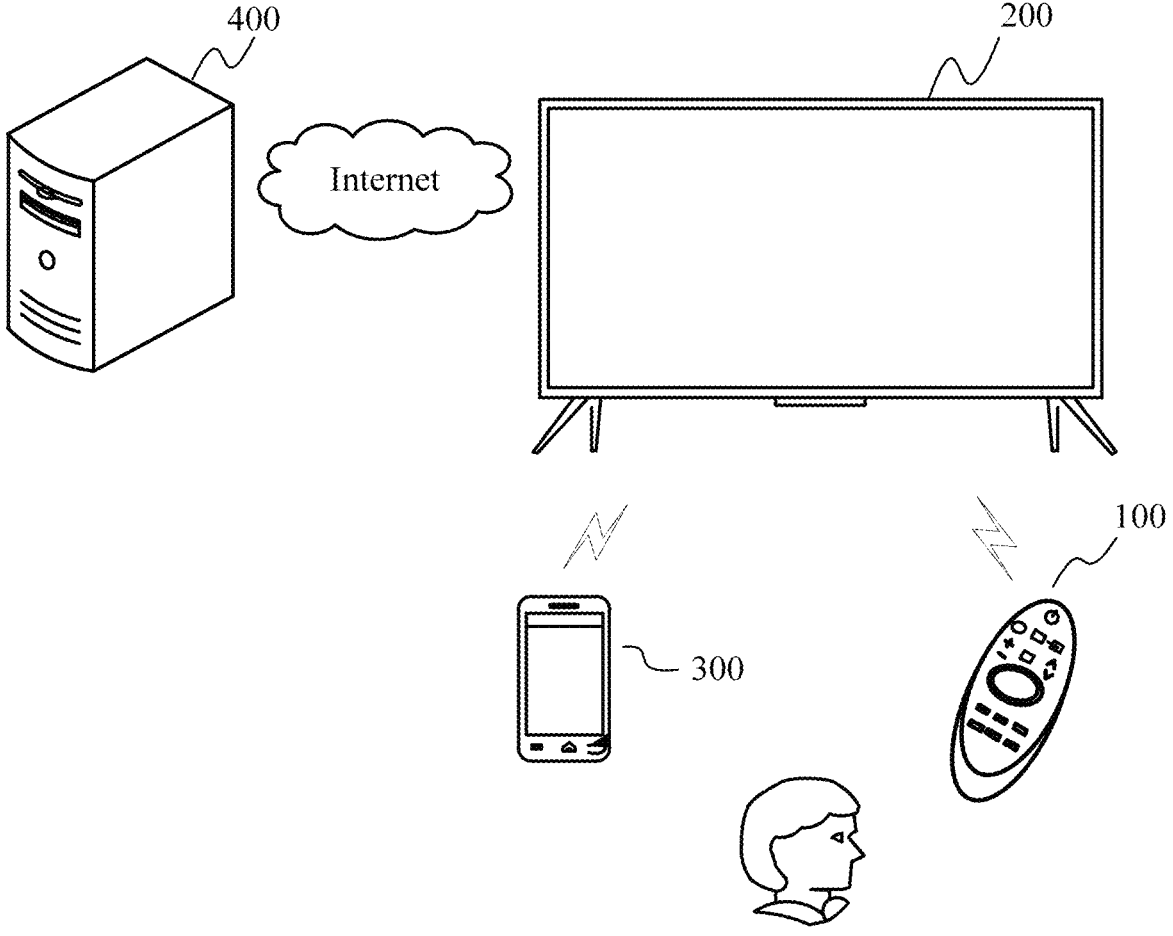
FIG. 13 is a schematic diagram of an operation scenario between a display apparatus and a control device according to embodiments of the present disclosure.

FIG. 13 is a schematic diagram of an operation scenario between a display apparatus and a control device according to embodiments of the present disclosure. As shown in FIG. 13, a user may operate a display apparatus 200 through a mobile terminal 300 and a control device 100.

In some embodiments, the control device 100 may be a remote control. A communication between the remote control and the display apparatus includes an infrared protocol communication, or a Bluetooth protocol communication, or other short-distance communications. The display apparatus 200 is controlled through wireless or other wired methods.

The display apparatus 200 may be a liquid crystal display, an OLED display, or a projection display apparatus. A specific type, size, and resolution of the display apparatus are not limited, and those skilled in that art will appreciate that, the display apparatus 200 may make some changes in performance and configuration as desired.

Figure 14:
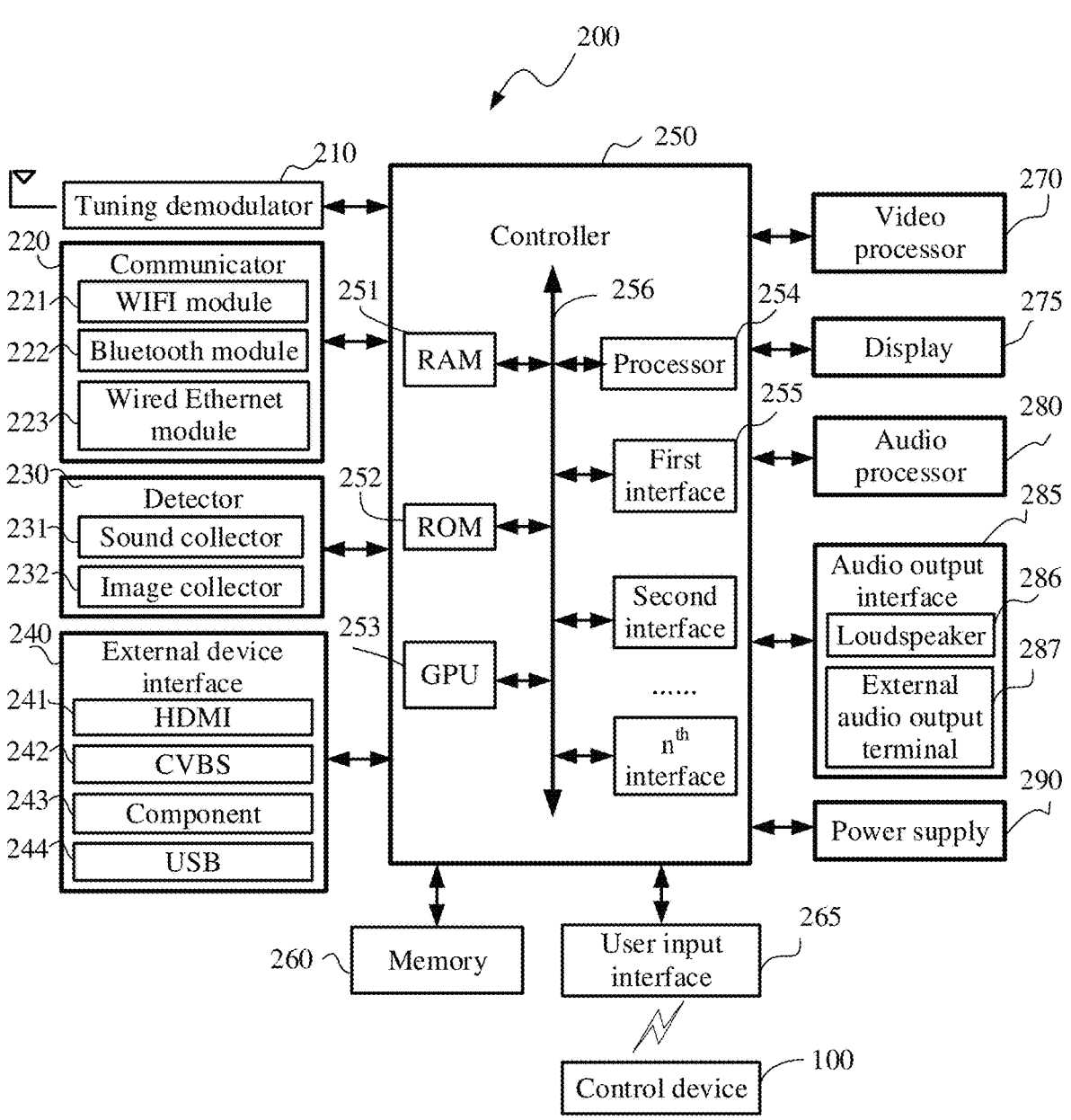
FIG. 14 is a block diagram of a hardware configuration of a display apparatus 200 according to embodiments of the present disclosure.

FIG. 14 is a block diagram of a hardware configuration of a display apparatus 200 according to embodiments of the present disclosure.

In some embodiments, the display apparatus 200 includes at least one of a controller 250, tuning demodulator 210, a communicator 220, a detector 230, an input/output interface 255, a display 275, an audio output interface 285, a memory 260, a power supply 290, a user input interface 265, and an external device interface 240.

In some embodiments, as shown in FIG. 14, the input/output interface 255 is configured to perform data transmission between the controller 250 and other external devices or other controllers 250, such as receive video signal data and audio signal data, or command instruction data from an external device.

In some embodiments, the external device interface 240 may include at least one of but not limit to: a high definition multimedia interface (HDMI), an analog or data high-definition component input interface, a composite video input interface, a Universal Serial Bus (USB) input interface, or an RGB interface, and may be a composite input/output interface formed by the above interfaces.

In some embodiments, the controller 250 controls an operation of the display apparatus and responds to an operation of a user through various software control programs stored in the memory. The controller 250 may control an overall operation of the display apparatus 200. For example, the controller 250 may perform operations corresponding to a selected object in response to a user command for selecting an object presented on the display 275.

As shown in FIG. 14, the controller 250 includes at least one of: a Random Access Memory (RAM) 251, a Read-Only Memory (ROM) 252, a video processor 270, an audio processor 280, another processor 253 (e.g. a Graphics Processing Unit (GPU)), a Central Processing Unit (CPU) 254, a communication interface, and a communication bus (Bus) 256. The communication bus connects various components.

The power supply 290, under control of the controller 250, supplies power to the display apparatus 200 with power input from an external power source. The power supply 290 may include a built-in power supply circuit installed inside the display apparatus 200, and may also be a power supply installed outside the display apparatus 200, and a power supply interface of an external power supply is provided in the display apparatus 200.

The user input interface 265 is configured to receive an input signal from a user and then send the received input signal from the user to the controller 250. The input signal from the user may be a remote control signal received through an infrared receiver, and various control signals from the user may be received through a network communication module.

In some embodiments, a user inputs a user command through the control device 100 or the mobile terminal 300, the user input interface receives the user's input, and the display apparatus 200 responds to the user's input through the controller 250.

As mentioned above, a driving component for driving the display apparatus for image display may be disposed in the display 275, or may be disposed in the controller 250, which is not limited herein.

At present, the display quality is generally improved by the multi-subarea local dimming technology of the television backlight, to meet the high requirement of the user on the image quality of the display screen. In the multi-subarea local dimming technology, a control board controls a plurality of driving chips, so that each of the driving chips is capable of driving a light-emitting diode (LED) lamp group (generally a mini LED lamp group) in a subarea for precise brightness control. Connection of a backlight driving system is complex due to the fact that the control board is connected with a plurality of driving chips through one terminal, driving chips and lamp groups in each subarea are respectively arranged on respective Printed Circuit Boards (PCBs), and then two PCBs are jointed to reduce volume of a backlight driving module. In this case, the cost of the backlight driving module is relatively high.

In view of the above technical problems, embodiments of the present disclosure provide a backlight driving module, and a plurality of terminals (hereinafter, a plurality of first terminals) are introduced into a control circuit of the backlight driving module, so that the control circuit of the backlight driving module is connected with a plurality of backlight driving circuits through the plurality of terminals respectively. Therefore, the circuit complexity of the backlight driving circuit is reduced, area of the PCB is reduced, and the cost of the backlight driving module is further reduced.

In embodiments of the present disclosure, the backlight driving module may be a driving component for driving image display in the display 275 shown in FIG. 14. Of course, it is not excluded that part of components in the backlight driving module are disposed in the controller and part of the components are disposed in the display. For example, a control circuit (such as a control board) in the backlight driving module is disposed in the controller 250 in FIG. 14, and a driving controller and a lamp group in the backlight driving module are disposed in the display 275 in FIG. 14.

Figure 15:
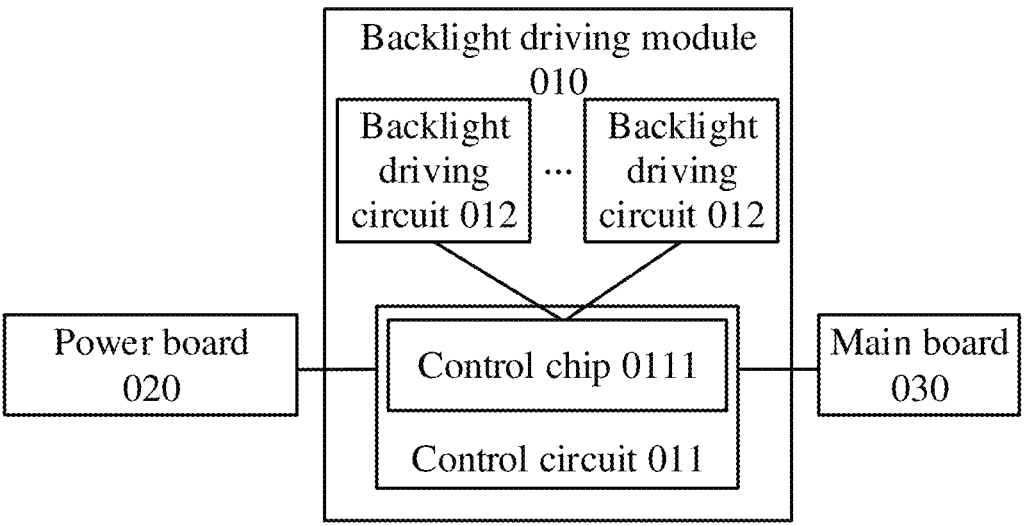
FIG. 15 is a schematic structural diagram of a display apparatus 001 according to embodiments of the present disclosure.

FIG. 15 is a schematic structural diagram of a display apparatus 001 according to embodiments of the present disclosure. In order to reduce the cost of a backlight driving circuit, embodiments of the present disclosure provides a display apparatus 001.

In embodiments of the present disclosure, a backlight module may be referred to as a backlight driving module. The backlight driving module includes a control circuit and a plurality of backlight driving circuits. The backlight driving circuit includes a substrate, a driving unit and a plurality of LED lamp groups. The substrate is a substrate of a circuit board, and the driving unit includes a driving chip and a peripheral circuit.

Referring to FIG. 15, the display apparatus 001 includes a backlight driving module 010, a power board 020, and a main board 030. The power board 020 and the main board 030 are both connected with a control chip 0111 of a control circuit 011 of the backlight driving module 010.

Optionally, both the power board 020 and the main board 030 may be a circuit board. The power board and the main board may be integrated on the same circuit board, or the power board and the main board may be independent circuit boards, which is not limited in the present disclosure.

A backlight driving circuit 012 in the backlight driving module 010 is configured to provide backlight brightness for a display area of the display apparatus 001.

The power board 020 is configured to supply power to the backlight driving circuit 012 in the backlight driving module 010 through the control chip 0111.

The main board 030 is configured to send a subarea control signal to the control chip 0111.

The control chip 0111 is configured to perform interaction of a signal with the backlight driving circuit 012 corresponding to the subarea control signal according to the subarea control signal, to control the backlight brightness for the display area.

The backlight driving module 010 in embodiments shown in FIG. 15 is described below by way of example.

Figure 16:
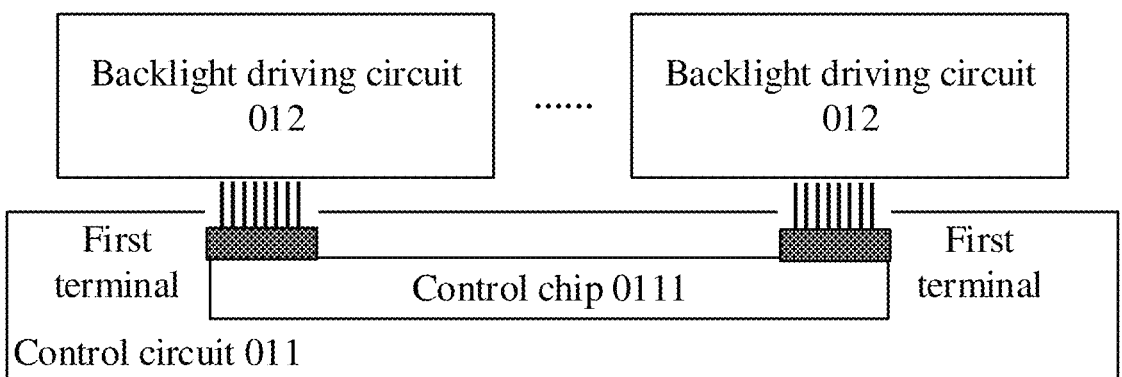
FIG. 16 is a schematic structural diagram of a backlight driving module according to embodiments of the present disclosure.

FIG. 16 is a schematic structural diagram of a backlight driving module according to embodiments of the present disclosure. Referring to FIG. 16, the backlight driving module 010 includes a control circuit 011 and a plurality of backlight driving circuits 012.

The control circuit 011 includes a control chip 0111 and a plurality of first terminals. One of the first terminals corresponds to one of the backlight driving circuits 012. In other words, the control circuit 011 may be connected with a corresponding backlight driving circuit 012 through one of the first terminals.

The control circuit 011 can perform interaction of a signal with each backlight driving circuit 012, and the signal includes a signal related to power supply and a communication signal related to driving control.

It is to be noted that a backlight driving circuit 012 is configured to control backlight brightness for a display area, and a plurality of display areas controlled by a plurality of backlight driving circuits 012 may constitute a display area of the display apparatus 001, to realize complete presentation of an image to be presented by the display apparatus 011.

The control circuit 011 described above may for example be disposed on a control board of a display apparatus. The control board and the main board may be integrated into one circuit board, or the control board and the main board may be independent circuit boards.

One of the plurality of backlight driving circuits 012 can be disposed on a PCB, for example.

In the embodiments, the control chip is connected with the plurality of backlight driving circuits through the plurality of first terminals respectively. Compared with the control chip being connected with all the backlight driving circuits through one terminal, the circuit complexity of the backlight driving circuit is reduced, and area of the circuit board is saved.

Figure 17:
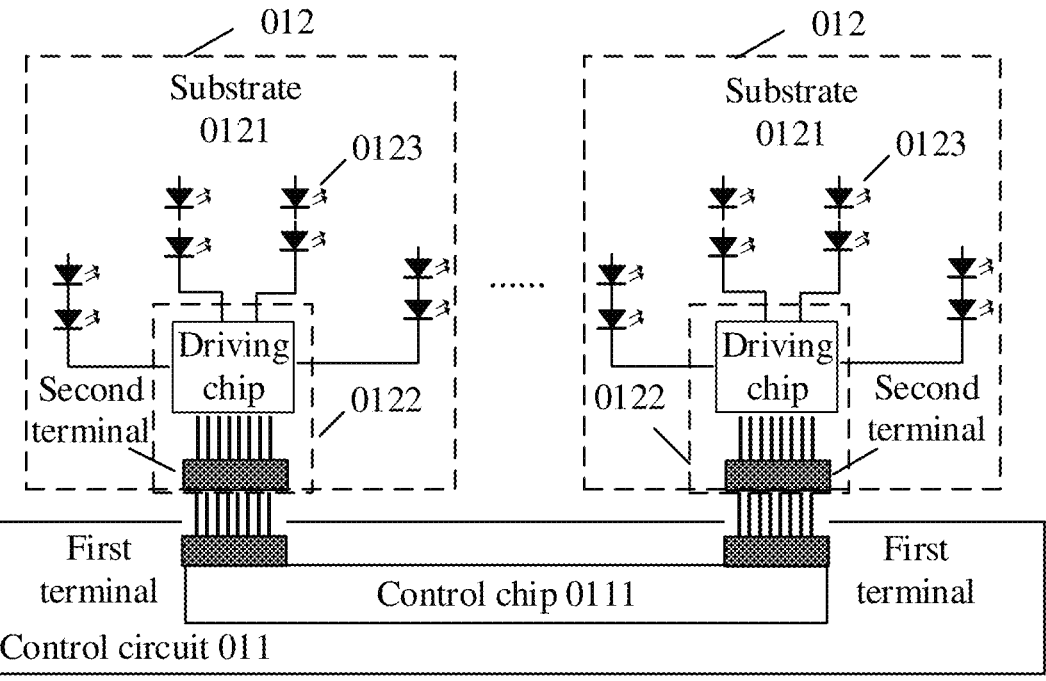
FIG. 17 is a schematic structural diagram of another backlight driving module according to embodiments of the present disclosure.

FIG. 17 is a schematic structural diagram of another backlight driving module according to embodiments of the present disclosure. Referring to FIG. 17, the backlight driving module 010 includes a control circuit 011 and a plurality of backlight driving circuits 012.

The control circuit 011 is similar to that of the embodiments shown in FIG. 16, and will not be described again.

Each of the plurality of backlight driving circuits 012 in the embodiments includes a substrate 0121, a driving unit 0122, and a plurality of LED lamp groups 0123. The driving unit 0122 and the plurality of LED lamp groups 0123 are disposed on a same layer of the substrate 0121. In embodiments of the present disclosure, the driving unit and the plurality of LED lamp groups are disposed on the same layer of the substrate. Compare with the structure that the driving unit and the plurality of LED lamp groups are respectively disposed on respective substrates, the substrate overhead is saved, and the cost is reduced.

The substrate may be, for example, an aluminum base board on which a PCB is disposed, or simply a PCB. The driving unit 0122 and the plurality of LED lamp groups 0123 are disposed on the substrate 0121. The driving unit 0122 may be integrated on a lamp board where the plurality of LED lamp groups 0123 are located.

Generally, the substrate and the control board are independent of each other, and the substrate and the control board are connected through terminals.

The driving unit 0122 may include a driving controller and a second terminal, and the driving controller is connected with the plurality of LED lamp groups. A first terminal of the control circuit 011 and a second terminal of the driving unit 0122 may be connected. Furthermore, the control chip 0111 may be connected with the driving controller through the first terminal and the second terminal, for interaction of a signal with the driving controller, the signal includes a signal related to power supply and a communication signal related to driving control.

Optionally, the driving controller is a driving control chip.

In some embodiments, the signal related to power supply may include, for example, at least one of: a signal for providing power to the LEDs, a signal for providing power to the driving controller, a FeedBack (FB) signal for a power source, or a Ground (GND) signal.

Optionally, the communication signal related to the driving control may include, for example, at least one signal in a Serial Peripheral Interface (SPI) signal group, and the SPI signal group may include, for example, a Serial Clock line (SCK) signal, a Serial Data Input (SDI) signal, a Serial Data Output (SDO) signal, a Chip select (CS) signal, etc.

The above listed signal related to power supply and the communication signal related to driving control are examples, but not for restricting descriptions.

It should be understood that a driving controller is configured to control the backlight brightness for a display area. That is, a driving controller is configured to control brightness of a plurality of corresponding LED lamp groups to realize adjustment of the brightness of the display area. A plurality of display areas controlled by a plurality of driving controllers may constitute a display area of the display apparatus 001, to realize complete presentation of an image to be presented by the display apparatus 011.

Optionally, the driving controller may be a 32-channel integrated LED driving controller or a 16-channel integrated LED driving controller. It should be understood that the 32-channel integrated LED driving controller can be connected with 32 LED lamp groups, and the 16-channel integrated LED driving controller can be connected with 16 LED lamp groups.

In the embodiments, the driving unit and the plurality of LED lamp groups are disposed on the same layer of the substrate. Compare with the structure that the driving unit and the plurality of LED lamp bank are respectively disposed on respective substrates, the substrate overhead is saved, and the cost is reduced.

In some embodiments, the driving controller may be connected with the second terminal through a plurality of signal lines on the substrate 0121. The second terminal is connected with the first terminal through a flat cable, and the flat cable includes the plurality of signal lines.

Figure 18:
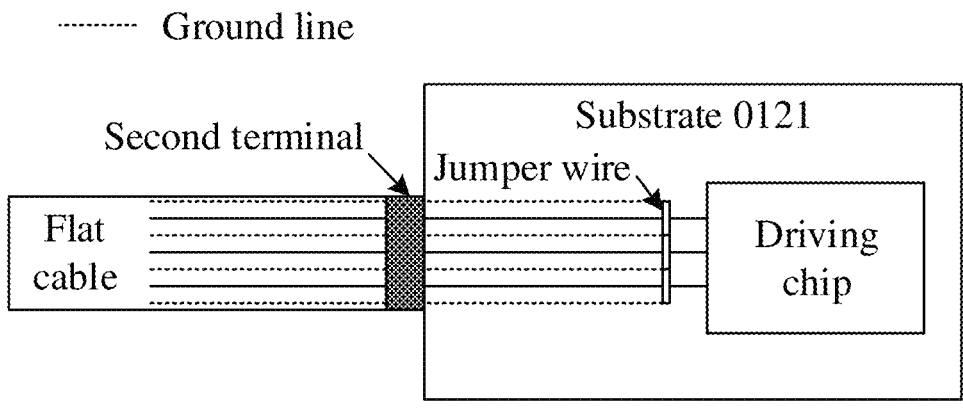
FIG. 18 is a schematic block diagram of a flat cable according to embodiments of the present disclosure.

As shown in FIG. 18, the driving controller is connected with the second terminal through three signal lines. For example, each of the signal lines is configured to transmit a signal. For example, the three signal lines are configured to transmit a clock signal, a data input signal, and a data output signal, respectively.

As shown in FIG. 18, every two signal lines are isolated by a ground line. The flat cable is located between ground lines on a side of the driving controller, and is connected with a ground end of the substrate through a jumper wire, to realize grounding processing of different signals.

An arrangement sequence of the plurality of signal lines is consistent with an arrangement sequence of pins for transmitting corresponding signals in the driving controller, to ensure that the signal lines do not cross each other.

The flat cable may for example be a Flexible Flat Cable (FFC) flat cable.

Figure 19A:
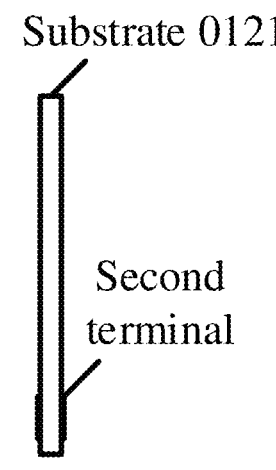
FIG. 19A is a side view of a sunk terminal according to embodiments of the present disclosure.
Figure 19B:
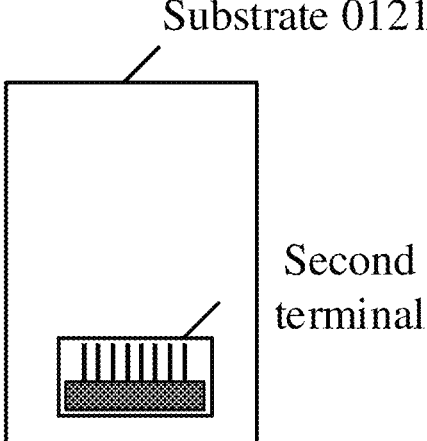
FIG. 19B is a front view of a sunk terminal according to embodiments of the present disclosure.

In some embodiments, the second terminal is disposed on the substrate by sinking, or embedded in the substrate. Referring to a side view of the substrate 0121 shown in FIG. 19A and a front view of the substrate 0121 shown in FIG. 19B, the second terminal is embedded in the substrate, so that the flat cable can be connected with the second terminal from a back surface of the substrate, and the flat cable is conveniently connected with the chip from an outer side of the backlight driving circuit. Therefore, the driving controller and the LED lamp group disposed on a front surface of the substrate are not interfered.

Optionally, because the terminal is of a sinking type, in order to avoid affecting mechanical strength of the terminal when a wire is inserted and pressed, a direction of the second terminal for connecting the flat cable has an inclination angle relative to the substrate, to avoid a direction for inserting a wire from being perpendicular to the substrate.

Figure 20A:
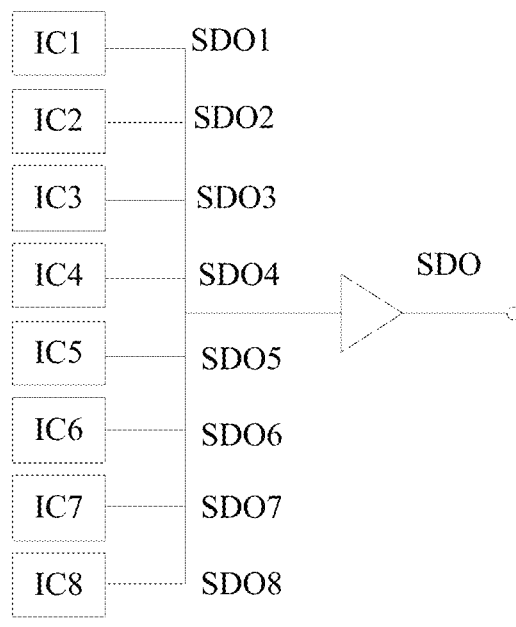
FIG. 20A is a schematic diagram of a buffer unit according to embodiments of the present disclosure.

Since each driving controller corresponds to a second terminal and a first terminal, interfaces of SPI communication of the control chip may be more, generally several or dozens. However, a SDO signal in the SPI communication is sent by the driving controller itself, so the driving capability is insufficient. After passing through a long connecting line (such as a flat cable), data transmission is often abnormal due to delay. Taking FIG. 20A as an example, eight SDOs are combined into a SDO to be input to the control chip, and data delay is large under an influence of a parasitic capacitor.

It should be understood that the SDO signal is only an example of a data output signal and is not intended to be limiting of the present disclosure. The SDO signal in the above embodiments may be replaced by any data output signal.

Figure 20B:
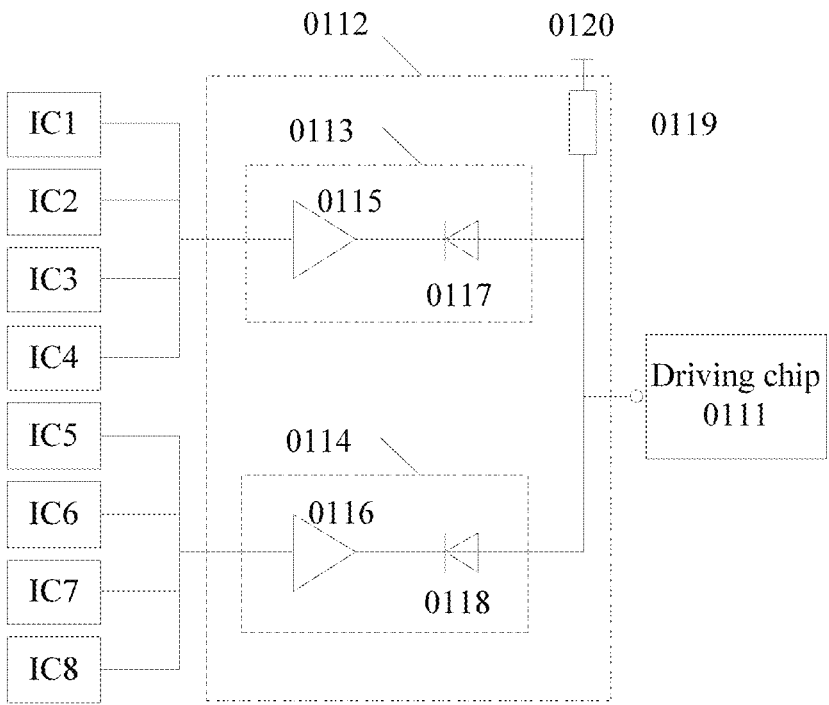
FIG. 20B is a schematic block diagram of a buffer unit according to embodiments of the present disclosure.

In view of the above technical problems, in the embodiments, a buffer unit is disposed in the control circuit 011 on the basis of any one of the foregoing embodiments. As shown in FIG. 20B, a buffer unit 0112 is disposed between a plurality of first terminals of the control circuit 011 and the control chip 0111. The buffer unit 0112 includes a plurality of buffer sub-units 0113, each of the buffer sub units 0113 is connected with a plurality of first terminals through a signal line for transmitting a data output signal, to obtain and combine data output signals of the first terminals, and send combined data output signals to the control chip 0111.

For example, as shown in FIG. 20B, it is assumed that the control chip is connected with eight driving controllers through eight first terminals, respectively. Each of the driving controllers outputs one data output signal through one pin of the first terminal (e.g., any pin of IC1 to IC8 in FIG. 20B), respectively. A buffer sub-unit 0113 in the buffer unit 0112 merges four data output signals output from the IC1 to the IC4 and sends the merged data output signals to the control chip 0111, and a buffer sub-unit 0114 merges four data output signals output from the IC5 to IC8 and sends the merged data output signals to the control chip 0111.

In some embodiments, the buffer sub-unit includes a buffer and a diode. For example, the buffer sub-unit 0113 in FIG. 20B includes a buffer 0115 and a diode 0117, and the buffer sub-unit 0114 includes a buffer 0116 and a diode 0118.

An input terminal of the buffer is connected with a plurality of first terminals through a signal line for transmitting a data output signal, an output terminal of the buffer is connected with a cathode of the diode, and an anode of the diode is connected with the control chip. For example, an input terminal of the buffer 0113 in FIG. 20B is connected with data output pins of a plurality of first terminals through a signal line, an output terminal of the buffer 0113 is connected with the cathode of the diode 0117, and the anode of the diode 0117 is connected with the control chip 0111. The connection of the buffer 0114 is similar to that of the buffer 0113, which will not be described here.

In some embodiments, the buffer unit 0112 further includes a pull-up resistor 0119, and the control circuit 011 further includes a power supply terminal 0120.

An end of the pull-up resistor 0119 is connected with the power supply terminal 0120, and the other end of the pull-up resistor 0119 is connected with the anode of each diode (such as 0117 and 0118).

It should be noted that directly connecting output terminals of a plurality of buffers (such as the buffers 0113 and 0114 in FIG. 20B) may cause problems such as mutual connection. Therefore, in the above embodiments, a diode can be added at an output terminal of each buffer for isolation, and then through an action of a pull-up resistor, problems such as mutual connection can be avoided.

The display apparatus may include following processes when performing driving for subareas.

The main board may send a subarea control signal to the control chip in the control circuit. The control chip generates a control signal (i.e., the aforementioned communication signal related to driving control) for each backlight driving circuit according to the subarea control signal), and sends each control signal to the corresponding backlight driving circuit. A driving controller in each backlight driving circuit controls a plurality of connected LED lamp groups to turn on or turn off according to the control signal received, and controls e brightness of each LED lamp group, so that backlight brightness of the display area is controlled.

A liquid crystal display apparatus is a passive type display apparatus, which requires a backlight source to provide backlight for image display. Based on an installation position of the backlight source, the backlight source can be categorized into an edge-lit type and a direct type. The edge-lit type refers to that the backlight source is located on a side of a screen and lights up a back area of the screen through a light guide plate. The direct type refers to that a point-array backlight source is located on a back surface of the screen and directly lights up a back area of the screen. Local dimming technology is to divide the backlight source into subareas and control brightness of the backlight source in each subarea separately, so that the backlight control is relatively fine, and image quality performance is greatly improved.

However, as a size of the display apparatus increases, a size of the backlight also increases, resulting in an increase in backlight source subareas and a more complex hardware structure of the display apparatus.

Figure 21:
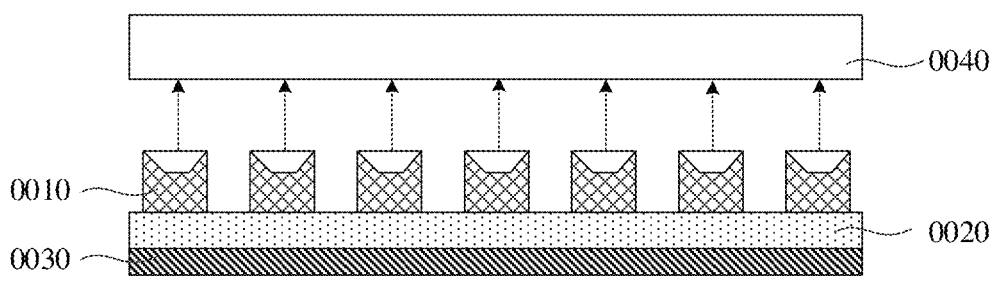
FIG. 21 is a schematic structural diagram of a display apparatus according to embodiments of the present disclosure.

FIG. 21 is a schematic structural diagram of a display apparatus according to embodiments of the present disclosure. In order to reduce complexity of the hardware structure of the display apparatus, as shown in FIG. 21, the display apparatus according to embodiments of the present disclosure includes a backlight source 0010, an optical film 0020, a backplane 0030, and a display screen 0040. The backlight source 0010, the optical film 0020, and the backplane 0030 belong to a backlight module. The optical film 0020 is located on a side of the backplane 0030, and the backlight source 0010 is located on a side of the optical film 0020 away from the backplane 0030. The display screen 0040 is located on a side of the backlight source 0010 away from the backplane 0030.

The display screen 0040 is configured to present an image to a user, and the backlight source 0010 is located between the display screen 0040 and the optical film 0020. The optical film 0020 is located between the backlight source 0010 and the backplane 0030. The backlight source 0010 cooperates with the optical film 0020, for providing sufficient brightness and a uniformly distributed light source, so that the display screen 0040 can display images normally. Generally, some convex structures are formed on the backplane 0030 by stamping, and a main board and a power board of the display apparatus are fixed on the convex structures by screws or hooks. In some embodiments, the display apparatus may further include a rear housing that covers the display screen 0040, to hide the optical film 0020, the backlight source 0010, the main board, the power board and other parts of the display apparatus, achieving an aesthetic effect.

Figure 22:
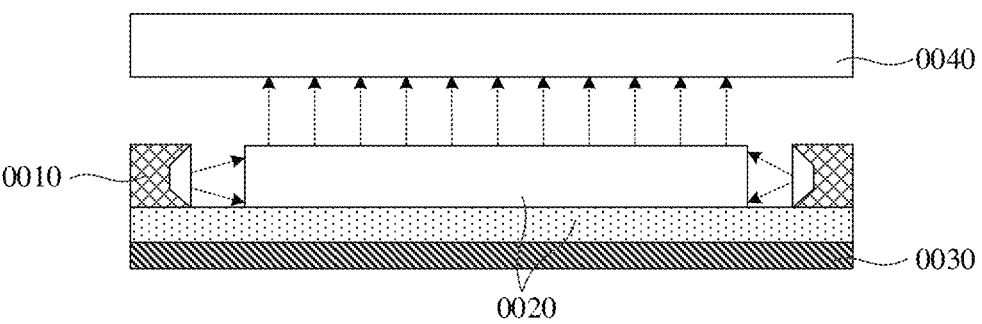
FIG. 22 is a schematic structural diagram of a display apparatus according to embodiments of the present disclosure.

The backlight source 0010 may also be mounted on a back surface of the display screen 0040, i.e., a direct type backlight source. As shown in FIG. 21, the backlight source 0010 is installed in an area of a back surface of the display screen 0040 corresponding to a display area, and a light-emitting surface of the backlight source 0010 faces the display area. A light beam emitted from the backlight source 0010 can directly illuminate an area corresponding to the display area to provide backlight for the display screen 0040. The backlight source 0010 may also be mounted on a side of the display screen 0040, i.e., an edge-lit type backlight source. As shown in FIG. 22, the backlight source 0010 is installed in an area of a rear edge of the display screen 0040. An optical film 0020 is disposed in an area of a back surface of the display screen 0040 corresponding to the display area. A light-emitting surface of the backlight source 0010 faces a side surface of the optical film 0020, and a light beam emitted from the backlight source 0010 irradiates the side surface of the optical film 0020. After being conducted by the optical film 0020, the light is emitted from a light-emitting surface of the optical film 0020, so that an area corresponding to the display area can be illuminated to provide backlight for the display screen 0040.

The display apparatus according to embodiments of the present disclosure may be a mobile phone, a tablet computer, a notebook computer, and may also be any product with display function such as a television, a display, a digital photo frame, a navigator, an intelligent wearable display apparatus, etc., which is not limited in embodiments of the present disclosure.

Figure 23A:
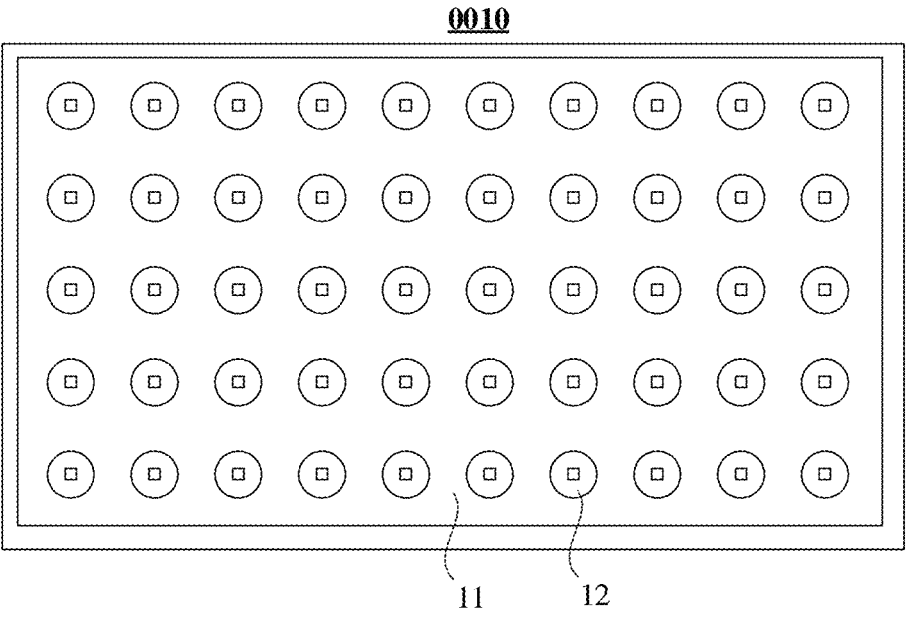
FIG. 23A is a schematic structural diagram of a backlight source according to embodiments of the present disclosure.
Figure 23B:
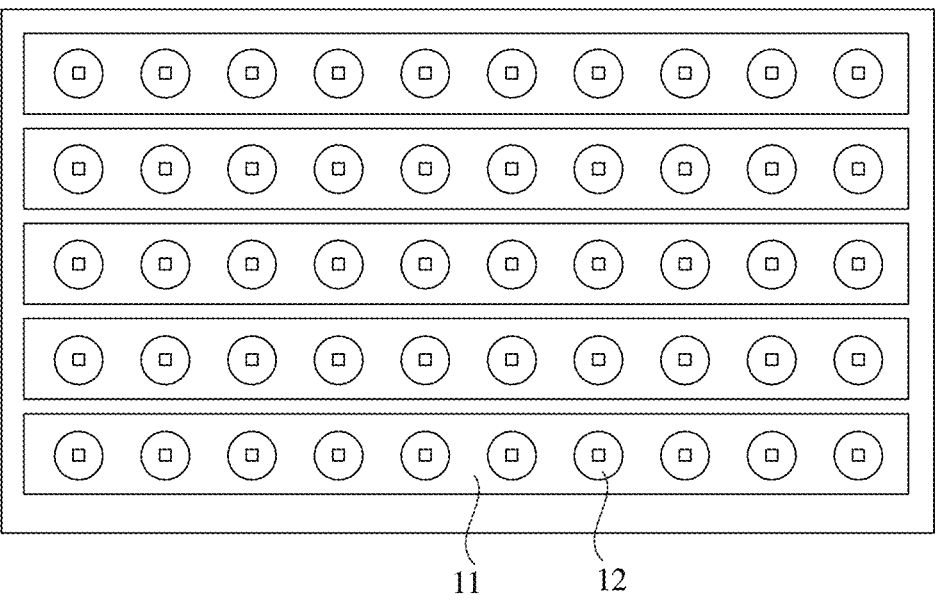
FIG. 23B is a schematic structural diagram of a backlight source according to embodiments of the present disclosure.
Figure 23C:
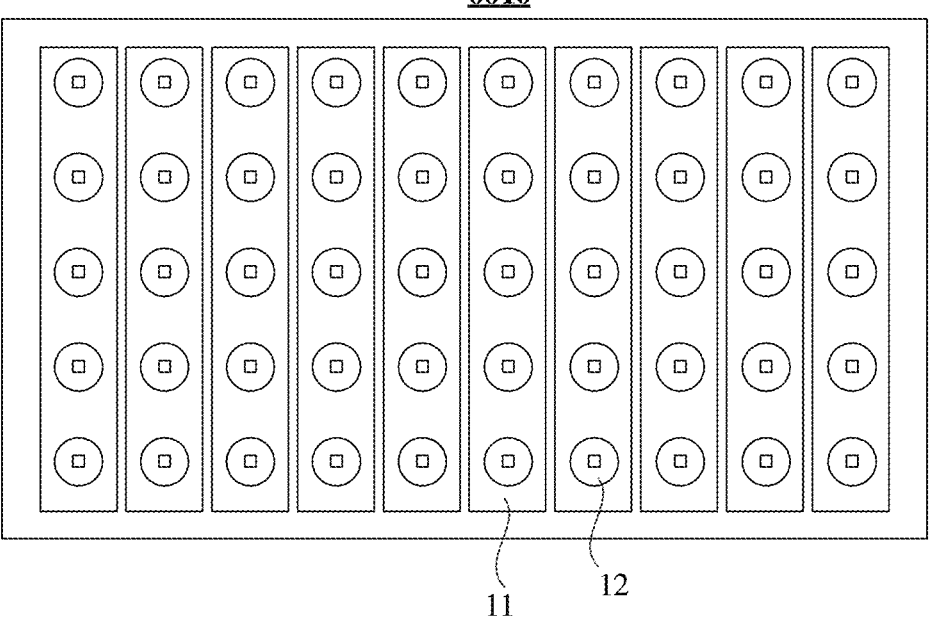
FIG. 23C is a schematic structural diagram of a backlight source according to embodiments of the present disclosure.
Figure 23D:
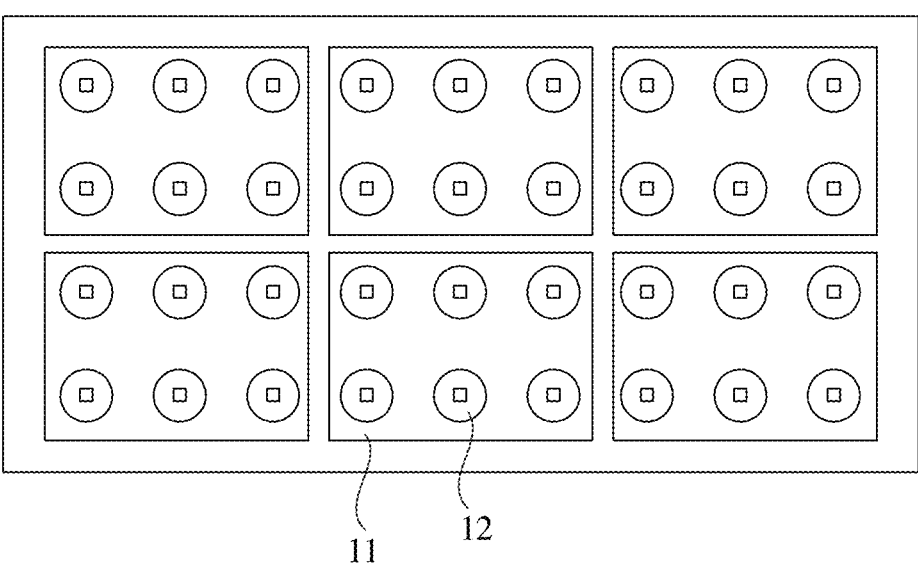
FIG. 23D is a schematic structural diagram of a backlight source according to embodiments of the present disclosure.

The backlight source 0010 in embodiments of the present disclosure is a direct type backlight source, and may include a lamp board 11, as shown in FIG. 23A, an array of light-emitting units 12 arranged in an M×N array are disposed on the lamp board 11. M and N are both positive integers. The backlight source 0010 may further include a plurality of lamp boards 11, adjacent lamp boards 11 are spliced, and a plurality of light-emitting units 12 are disposed on each of the lamp boards 11. The plurality of light-emitting units 12 disposed on each of the lamp boards 11 may be arranged in a 1×N array, as shown in FIG. 23B; or, the plurality of light-emitting units 12 disposed on each of the lamp boards 11 may be arranged in an M×1 array, as shown in FIG. 23C; or, the plurality of light-emitting units 12 disposed on each of the lamp boards 11 may be arranged in an M×N array, as shown in FIG. 23D. The light-emitting unit 12 may be a Light Emitting Diode (LED) lamp bead, or may be a sub-millimeter light-emitting diode (Mini LED) light bead, or may also be a micro light-emitting diode (Micro LED) light bead.

All the light-emitting units on all the lamp boards in embodiments of the present disclosure can be divided into a plurality of light-emitting areas, and each of the light-emitting areas includes a light-emitting unit or a plurality of light-emitting units. When the light-emitting area is small, one LED is enough to illuminate the whole light-emitting area, and a light-emitting unit is included in the light-emitting area. When the light-emitting area is large, a LED, Mini LED, or Micro LED is not enough to illuminate the entire light-emitting area, a plurality of light-emitting units are included in the light-emitting area to ensure that the entire light-emitting area is illuminated. Brightness of light-emitting units in different light-emitting areas can be controlled by taking a light-emitting area as the minimum control unit. Brightness of all light-emitting units in the same light-emitting area is the same, and brightness of light-emitting units in different light-emitting areas can be the same or different. In this way, area control for the backlight source can be realized based on the light-emitting area, and the image display quality of the display apparatus can be improved.

A first end of a driving unit in embodiments of the present disclosure can be electrically connected with part of light-emitting units in the same light-emitting area, or can be electrically connected with all light-emitting units in the same light-emitting area. For example, if a quantity of light-emitting units in a light-emitting area is large, and a single driving unit is not sufficient to drive all the light-emitting units in the light-emitting area, then all the light-emitting units in the light-emitting area can be set to be electrically connected with first ends of a plurality of driving units. In this case, part of the light-emitting units in the same light-emitting area are electrically connected with a first end of a single driving unit. If the quantity of light-emitting units in the light-emitting area is small, and a single driving unit is sufficient to drive all light-emitting units in the light-emitting area, then all the light-emitting units in the light-emitting area can be set to be electrically connected with a first end of one driving unit. In this case, all the light-emitting units in the same light-emitting area are electrically connected with the first end of a driving unit.

In summary, the same driving unit can only drive light-emitting units in the same light-emitting area, all driving units in the same light-emitting area receive the same subarea control signal, so that driving units in the same light-emitting area can generate the same driving signal, and all light-emitting units in the same light-emitting area emit light beams of the same brightness under action of the same driving signal. For light-emitting areas Z1 and Z2 of different brightness, a driving unit in the light-emitting area Z1 and a driving unit in the light-emitting area Z2 receive different subarea control signals, generate different driving signals D1 and D2 respectively, and the driving signals D1 and D2 are different. Brightness of a light beam emitted from a light-emitting unit in the light-emitting area Z1 under action of the driving signal D1 is different from brightness of a light beam emitted from a light-emitting unit in the light-emitting area Z2 under action of the driving signal D2, realizing subarea control of the backlight source.

An adapter plate in embodiments of the present disclosure is configured to transmit a control signal to a driving unit. In some embodiments adapter plate may also be electrically connected with the driving unit and the light-emitting unit. A plurality of metal wires are disposed on the adapter plate. Part of the metal wires may be configured to transmit control signals, and part of the metal wires may be configured to transmit power signals. In this case, a metal wire configured to transmit a control signal may be referred to as a control signal line, and a metal wire configured to transmit a power signal is referred to as a power signal line. The control signal line may be electrically connected with a second end of the driving unit. Second ends of all driving units electrically connected with light-emitting units in the same light-emitting area are electrically connected with the same control signal line, so that a quantity of metal wires can be saved.

Figure 24:
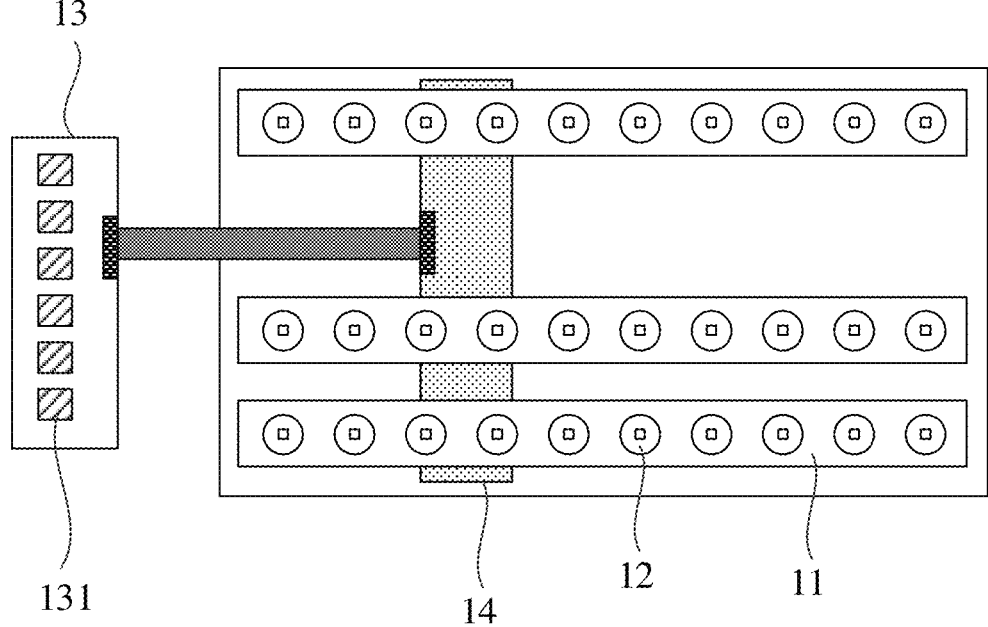
FIG. 24 is a schematic structural diagram of a backlight source according to embodiments of the present disclosure.

FIG. 24 is a schematic structural diagram of a backlight source according to embodiments of the present disclosure. The backlight source 0010 further includes a driving board 13 and an adapter plate 14.

A plurality of driving units 15 are disposed on the driving board 13, and a connecting line is disposed between the driving board 13 and the adapter plate 14. A driving unit 15 on the driving board 13 is electrically connected with the adapter plate 14 through the connecting line. The adapter plate 14 is also electrically connected with a light-emitting unit 12 on the lamp board 11. In this way, a driving signal output from the driving unit 15 is sent to the light-emitting unit 12 through the driving board 13, the connecting line, the adapter board 14 and the lamp board 11 in sequence. Light-emitting units 12 in each light-emitting area receive the same driving signal, so that brightness of the light-emitting units 12 in each light-emitting area is the same, and subarea control of a large-size backlight source is realized.

In embodiments of the present disclosure, the driving unit can be disposed on the lamp board or the adapt plate, so that a circuit of the backlight source can be simplified without additionally disposing a driving board and a connecting line of the driving board. Therefore, complexity of a hardware structure of the display apparatus can be reduced, and the cost of the display apparatus can be reduced. In addition, space occupied by the backlight source can be reduced, so that there is sufficient space for other functional modules, which is beneficial to multifunctional development of the display apparatus.

Embodiments of the present disclosure are described in detail below with several specific examples.

Figure 25:
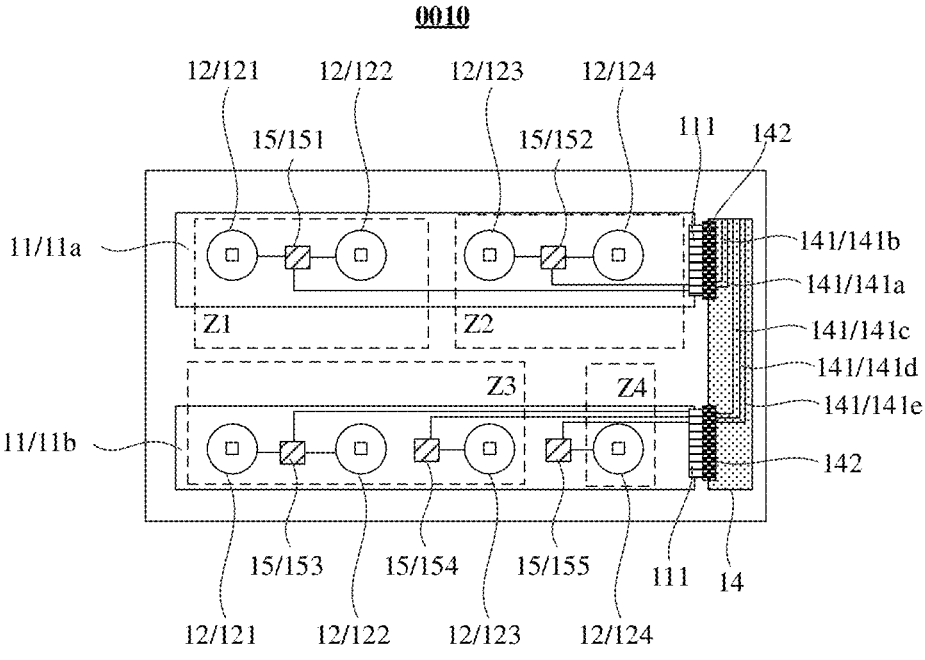
FIG. 25 is a schematic structural diagram of a backlight source according to embodiments of the present disclosure.
Figure 26:
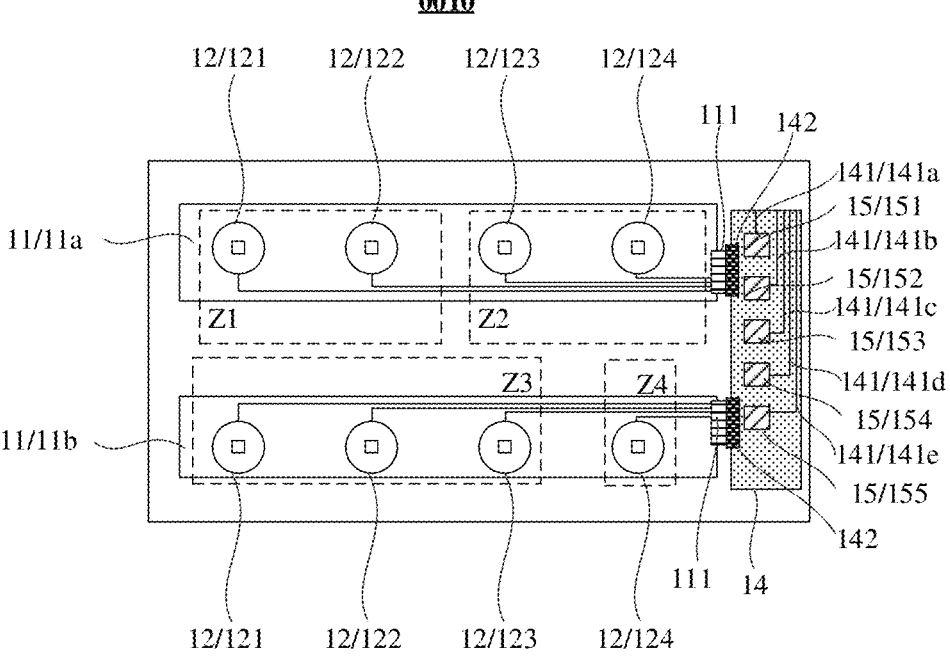
FIG. 26 is a schematic structural diagram of a backlight source according to embodiments of the present disclosure.

FIG. 25 is a schematic structural diagram of a backlight source according to embodiments of the present disclosure. FIG. 26 is a schematic structural diagram of a backlight source according to embodiments of the present disclosure. As shown in FIG. 25 and FIG. 26, the backlight source 0010 includes a lamp board 11, a plurality of driving units 15, and an adapter plate 14.

The backlight source 0010 may include a lamp board 11 or a plurality of lamp boards 11. As shown in FIGS. 23A-23D, a plurality of light-emitting units 12 are disposed on each lamp board 11. All light-emitting units 12 on all lamp boards 11 in the backlight source 0010 may be divided into a plurality of light-emitting areas Z. Each of the light-emitting areas Z includes one light-emitting unit 12 or a plurality of light-emitting units 12. Brightness of all light-emitting units 12 in the same light-emitting area Z is the same, and brightness of light-emitting units 12 in different light-emitting areas Z may be the same or different.

All driving units 15 may be disposed on the lamp board 11, as shown in FIG. 25, or may be disposed on the adapter plate 14, as shown in FIG. 26. A first end of each of the driving units 15 is electrically connected with part of the light-emitting units 12 or all of the light-emitting units 12 in the same light-emitting area Z. Accordingly, each of the driving units 15 can control part of the light-emitting units 12 or all of the light-emitting units 12 in the same light-emitting area Z to display the same brightness. All driving units 15 in the same light-emitting area can control all the light-emitting units 12 in the light-emitting area to display in the same brightness.

A plurality of control signal lines 141 are disposed on the adapter plate 14, and the control signal lines 141 are electrically connected with second ends of the driving units 15.

As shown in FIGS. 25 and 26, the backlight source 0010 includes two lamp boards 11, which are a first lamp board 11a and a second lamp board 11b respectively. A first light-emitting unit 121, a second light-emitting unit 122, a third light-emitting unit 123, and a fourth light-emitting unit 124 are disposed on each of the first lamp board 11a and the second lamp board 11b. The first light-emitting unit 121 and the second light-emitting unit 122 on the first lamp board 11a belong to a first light-emitting area Z1, the third light-emitting unit 123 and the fourth light-emitting unit 124 on the first lamp board 11a belong to a second light-emitting area Z2, the first light-emitting unit 121, the second light-emitting unit 122, and the third light-emitting unit 123 on the second lamp board 11b belong to a third light-emitting area Z3, and the fourth light-emitting unit 124 on the second lamp board 11b belongs to a fourth light-emitting area Z4.

With further reference to FIGS. 25 and 26, a first driving unit 151 is disposed for the first light-emitting unit 121 and the second light-emitting unit 122 in the first light-emitting area Z1, and a first end of the first driving unit 151 is electrically connected with the first light-emitting unit 121 and the second light-emitting unit 122 respectively. A second driving unit 152 is disposed for the third light-emitting unit 123 and the fourth light-emitting unit 124 in the second light-emitting area Z2, and a first end of the second driving unit 152 is electrically connected with the third light-emitting unit 123 and the fourth light-emitting unit 124 respectively. A third driving unit 153 is disposed for the first light-emitting unit 121 and the second light-emitting unit 122 in the third light-emitting area Z3, and a first end of the third driving unit 153 is electrically connected with the first light-emitting unit 121 and the second light-emitting unit 122 respectively. A fourth driving unit 154 is disposed for the third light-emitting unit 123 in the third light-emitting area Z3, and a first end of the fourth driving unit 154 is electrically connected with the third light-emitting unit 123. A fifth driving unit 155 is disposed for the fourth light-emitting unit 124 in the fourth light-emitting area Z4, and a first end of the fifth driving unit 155 is electrically connected with the fourth light-emitting unit 124.

With further reference to FIG. 25 and FIG. 26, five control signal lines 141 are disposed on the adapter board 14. A first control signal line 141a is electrically connected with a second end of the first driving unit 151, a second control signal line 141b is electrically connected with a second end of the second driving unit 152, a third control signal line 141c is electrically connected with a second end of the third driving unit 153, a fourth control signal line 141d is electrically connected with a second end of the fourth driving unit 154, and a fifth control signal line 141e is electrically connected with a second end of the fifth driving unit 155.

The driving units 15 may be disposed on the lamp board 11, as shown in FIG. 25, or the driving units 15 may be disposed on the adapter plate 14, as shown in FIG. 26. Whether the driving units 15 are disposed on the lamp board 11 or on the adapter plate 14, a circuit of the backlight source can be simplified without additionally disposing a driving board and a connecting line of the driving board. Therefore, complexity of a hardware structure of the display apparatus can be reduced, and the cost of the display apparatus can be reduced. In addition, space occupied by the backlight source can be reduced, so that there is sufficient space for other functional modules, which is beneficial to multifunctional development of the display apparatus.

It should be noted that, in the embodiments, the quantity of lamp boards in the backlight source, the quantity of light-emitting units in each lamp board, the quantity of light-emitting units in each light-emitting area, and the quantity of the driving units electrically connected with all the light-emitting units in each light-emitting area are only described for examples. In practical applications, the quantity of lamp boards in the backlight source, the quantity of light-emitting units in each lamp board, the quantity of light-emitting units in each light-emitting area, and the quantity of the driving units electrically connected with all the light-emitting units in each light-emitting area can be set flexibly based on actual requirements, which is not limited in embodiments of the present disclosure.

In embodiments of the present disclosure, as shown in FIG. 25, the driving units 15 are disposed on the lamp board 11, one or more first connecting terminals 142 are disposed on the adapter plate 14, and one or more second connecting terminals 111 are disposed on the lamp board 11. One of the first connecting terminals 142 is electrically connected with one of the second connecting terminals 111, and a second end of a driving unit 15 is electrically connected with a control signal line 141 through a second connecting terminal 111 and a first connecting terminal 142.

As shown in FIG. 25, two first connecting terminals 142 are disposed on the adapter plate 14. Second connecting terminal 111 are disposed on the first lamp board 11a and the second lamp board 11b respectively. The first connecting terminals 142 and the second connecting terminals 111 may be electrically connected one by one through insertion. A second end of a driving unit 15 is electrically connected with a second connecting terminal 111, and a control signal line 141 is electrically connected with a first connecting terminal 142. The second end of the driving unit 15 may be electrically connected with the control signal line 141 through the second connecting terminal 111 and the first connecting terminal 142 in sequence. In this way, the first connecting terminal 142 and the second connecting terminal 111 are suitably connected together to electrically connect the lamp board 11 and the adapter board 14. A connecting line for the lamp board is not required to be disposed, so that a circuit of the backlight source can be simplified, complexity of a hardware structure of the display apparatus can be reduced, and the cost of the display apparatus can be reduced.

With further reference to FIG. 25, two connecting lines are disposed on the first lamp board 11a. A first connecting line electrically connects a second end of a first driving unit 151 and a second connecting terminal 111, and a second connecting line electrically connects a second end of a second driving unit 152 and a second connecting terminal 111. Three connecting lines are led out from the second lamp board 11b. A first connecting line electrically connects a second end of a third driving unit 153 and a second connecting terminal 111, a second connecting line electrically connects a second end of a fourth driving unit 154 and a second connecting terminal 111, and a third connecting line electrically connects a second end of a fifth driving unit 155 and a second connecting terminal 111. There is no need to dispose a connecting line on the lamp board 11 for each light-emitting unit 12, but a connecting line is disposed on the lamp board 11 for each driving unit 15. In this way, the quantity of connecting lines on the lamp board 11 can be reduced, and a circuit of the backlight source can be simplified, so that complexity of a hardware structure of the display apparatus can be reduced. In addition, since the quantity of connecting lines on the lamp board 11 is reduced, a larger quantity of light-emitting units 12 can be disposed on the lamp board 11, which is beneficial to large-size development of the display apparatus.

The quantity of connecting lines on the lamp board 11 is the same as a quantity of leads in the second connecting terminal 111. Since the quantity of connecting lines on the lamp board 11 is reduced, the quantity of leads in the second connecting terminal 111 is reduced, that is, space occupied by the second connecting terminal 111 is smaller, and correspondingly space occupied by the first connecting terminal 142 is smaller. In this way, a larger quantity of first connecting terminals 142 can be disposed on a single adapter plate 14, so that a quantity of adapter plates 14 can be reduced, and the cost of the display apparatus can be reduced.

In the embodiments, the driving unit is disposed on the lamp board, first connecting terminals are disposed on the adapter plate, and second connecting terminals are disposed on the lamp board, a second end of a driving unit is electrically connected with a control signal line through a second connecting terminal and a first connecting terminal. A connecting line for the lamp board is not required to be disposed, and a smaller quantity of connecting lines can be disposed on the lamp board, so that a circuit of the backlight source can be simplified, complexity of a hardware structure of the display apparatus can be reduced, and the cost of the display apparatus can be reduced. In addition, a larger quantity of light-emitting units can be disposed on the lamp board, which is beneficial to large-size development of the display apparatus. Furthermore, space occupied by the first connecting terminal can be reduced, a larger quantity of first connecting terminals can be disposed on a single adapter plate, so that a quantity of adapter plates can be reduced, and the cost of the display apparatus can be reduced.

In embodiments of the present disclosure, the driving unit 15 is disposed on a side surface of the lamp board 11 away from the light-emitting unit 12.

For example, the light-emitting unit 12 is disposed on a first surface of the lamp board 11, and a second surface of the lamp board 11 is opposite to the first surface. The driving unit 15 is disposed on the second surface, so that the driving unit 15 can be disposed on the side where the light-emitting unit 12 is not disposed. Therefore, when the light-emitting unit 12 emits a light beam, the driving unit 15 does not shield the light beam, and uniformity of the light beam emitted from the backlight source 0010 can be improved, ensuring the image display quality of the display apparatus.

In the embodiments, the driving unit is disposed on a side surface of the lamp board away from the light-emitting unit, so that when the light-emitting unit emits a light beam, the driving unit does not shield the light beam, uniformity of the light beam emitted from the backlight source can be improved, ensuring the image display quality of the display apparatus.

In embodiments of the present disclosure, as shown in FIG. 26, the driving unit 15 is disposed on the adapter plate 14, a first connecting terminal 142 is disposed on the adapter plate 14, and a second connecting terminal 111 is disposed on the lamp board 111. A first end of the driving unit 15 is electrically connected with the light-emitting unit 12 through the first connecting terminal 142 and the second connecting terminal 111.

For example, as shown in FIG. 26, two first connecting terminals 142 are disposed on the adapter plate 14. Second connecting terminal 111 are disposed on the first lamp board 11*a* and the second lamp board 11*b* respectively. The first connecting terminals 142 and the second connecting terminals 111 may be electrically connected one by one through insertion. A first end of a driving unit 15 is electrically connected with a first connecting terminal 142, and a light-emitting unit 12 is electrically connected with a second connecting terminal 111. The first end of the driving unit 15 may be electrically connected with the light-emitting unit 12 through the first connecting terminal 142 and the second connecting terminal 111 in sequence. In this way, the first connecting terminal 142 and the second connecting terminal 111 are suitably connected together to electrically connect the lamp board 11 and the adapter board 14. A connecting line for the lamp board is not required to be disposed, so that a circuit of the backlight source can be simplified, complexity of a hardware structure of the display apparatus can be reduced, and the cost of the display apparatus can be reduced.

In the embodiments, the driving unit is disposed on the adapter plate, first connecting terminals are disposed on the adapter plate, second connecting terminals are disposed on the lamp board, a first end of a driving unit is electrically connected with an light-emitting unit through a first connecting terminal and a second connecting terminal without disposing a connecting line for the lamp board, so that a circuit of the backlight source can be simplified, complexity of a hardware structure of the display apparatus can be reduced, and the cost of the display apparatus can be reduced.

Figure 27:
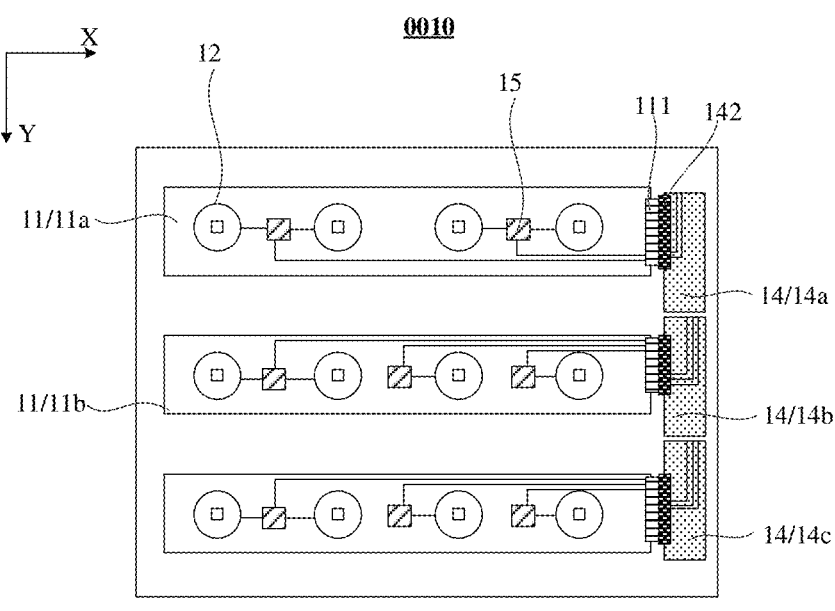
FIG. 27 is a schematic structural diagram of a backlight source according to embodiments of the present disclosure.

FIG. 27 is a schematic structural diagram of a backlight source according to embodiments of the present disclosure. In embodiments of the present disclosure, as shown in FIG. 27, the backlight source 0010 may include a plurality of adapter plates 14, and short sides of adjacent adapter plates 14 are disposed opposite to each other.

As shown in FIG. 27, an X direction is short-side direction of an adapter plate 14, and a Y direction is a long-side direction of the adapter plate 14. The backlight source 0010 may include a first adapter plate 14*a*, a second adapter plate 14*b*, and a third adapter plate 14*c*. The first adapter plate 14*a* may be disposed at first, to make the long-side direction of the first adapter plate 14*a* be parallel to a first direction. In some embodiments, after the first adapter plate 14*a* is disposed, one short side of a second adapter plate 14*b* may be spliced with a short side of the first adapter plate 14*a*, and then a short side of a third adapter plate 14*c* may be spliced with the other short side of the second adapter plate 14B. In some embodiments, after the first adapter plate 14*a* is disposed, one short side of a second adapter plate 14*b* may be disposed opposite to a short side of the first adapter plate 14*a*, and there is a gap between the one short side of the second adapter plate 14*b* and the short side of the first adapter plate 14*a*, then a short side of a third adapter plate 14*c* is disposed opposite to the other short side of the second adapter plate 14*b*, and there is a gap between the short side of the third adapter plate 14*c* and the other short side of the second adapter plate 14*b*. In this way, a length of a single adapter plate 14 can be reduced, so that process implementation of the adapter plate 14 is relatively simple.

Short sides of adjacent adapter plates 14 are spliced or disposed at intervals, so that long sides of the adapter plates 14 can be exposed, and first connecting terminals 142 can only be disposed on long sides of the adapter plates 14. In this way, a larger quantity of first connecting terminals 142 may be disposed on a single adapter plate 14, so that a quantity of adapter plates can be reduced, and the cost of the display apparatus can be reduced.

It should be noted that in embodiments shown in FIG. 27, the quantity of the adapter plates in the backlight source is described by taking three adapter plates as an example. In practical applications, the quantity of the adapter plates may be flexibly set based on actual requirements, which is not limited in embodiments of the present disclosure. It should also be noted that in embodiments shown in FIG. 27, for example, the long-side direction of the adapter plate is the Y direction, and the short-side direction of the adapter plate is the X direction. In other embodiments, the long-side direction of the adapter plate may be the X direction, and the short-side direction of the adapter plate may be the Y direction.

In the embodiments, the backlight source includes a plurality of adapter plates, short sides of adjacent adapter plates are disposed opposite to each other, so that a length of a single adapter plate can be reduced, and process implementation of the adapter plate is simple. In addition, first connecting terminals are disposed on long sides of the adapter plates through the opposite arrangement of the short sides of the adjacent adapter plates. In this way, a larger quantity of first connecting terminals may be disposed on a single adapter plate, so that a quantity of adapter plates can be reduced, and the cost of the display apparatus can be reduced.

In embodiments of the present disclosure, with further reference to FIG. 27, the backlight source 0010 includes a plurality of lamp boards 11 arranged along a long-side direction of the adapter plate 14. All light-emitting units 12 on each lamp board 11 are arranged along a short-side direction of the adapter plate, and the lamp board 11 is disposed in an area facing the long side of the adapter plate 14. A second connecting terminal 111 is disposed on a side of the lamp board 11 close to the adapter plate 14.

By way of example, as shown in FIG. 27, the backlight source 0010 includes a plurality of lamp boards 11 arranged in the Y direction. Light-emitting units 12 on each lamp board 11 are arranged along the X direction, and the lamp board 11 is a light bar. The lamp board 11 is disposed in an area facing the long side of the adapter plate 14. A second connecting terminal 111 is disposed on a side of the lamp board 11 close to the adapter plate 14. In this way, a second connecting terminal 111 is disposed on each lamp board 11, and the second connecting terminal 111 is disposed on a side most close to the adapter plate 14. Therefore, it is convenient to connect the second connecting terminal 111 and the first connecting terminal 142, that is, it is convenient to connect the lamp board 11 and the adapter board 14.

In the embodiments, the backlight source includes a plurality of lamp boards arranged along the long side direction of the adapter plate; all light-emitting units on each lamp board are arranged along the short side direction of the adapter plate, the lamp board is disposed in an area facing the long side of the adapter plate, the second connecting terminal is disposed on a side of the lamp board close to the adapter plate, so that it is convenient to connect the second connecting terminal and the first connecting terminal, that is, it is convenient to connect the lamp board and the adapter plate.

Figure 28:
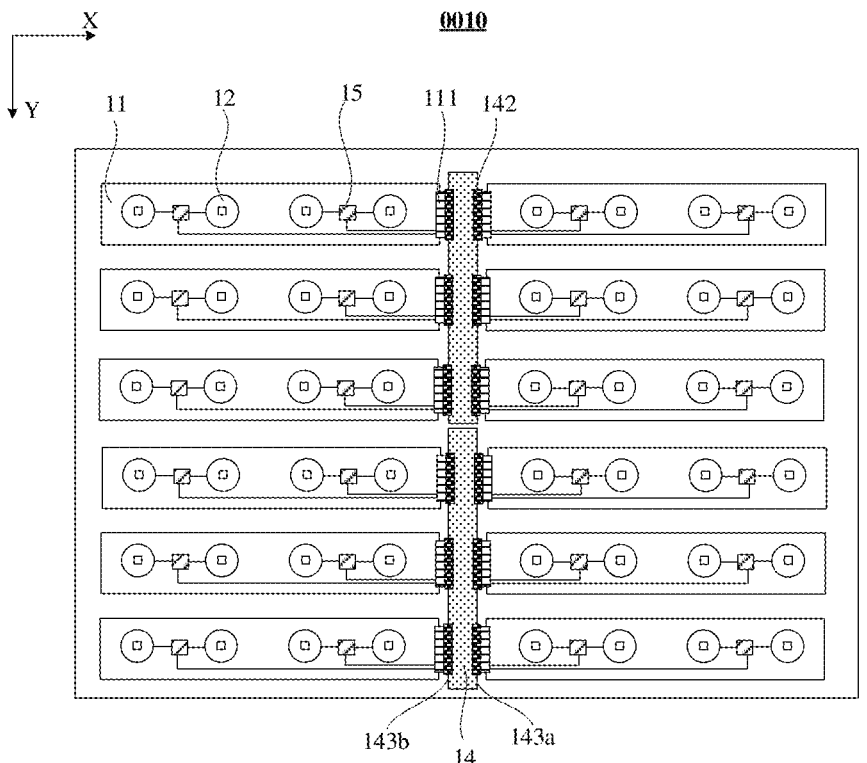
FIG. 28 is a schematic structural diagram of a backlight source according to embodiments of the present disclosure.

FIG. 28 is a schematic structural diagram of a backlight source according to embodiments of the present disclosure. As shown in FIG. 28, on the basis of the embodiment shown in FIG. 27, in embodiments of the present disclosure, a plurality of first connecting terminals 142 are disposed on two long sides of the adapter plate 14. The lamp boards 11 are disposed in areas facing the two long sides of the adapter plate 14. Along a long-side direction of the adapter plate 14, distances between adjacent first connecting terminals 111 are equal, and a distance between adjacent first connecting terminals 111 is not less than a width of the lamp board 11.

For example, as shown in FIG. 28, three first connecting terminals 142 are disposed on a first long side 143a of the adapter plate 14, and three first connecting terminals 142 are also disposed on a second long side 143b of the adapter plate 14. Part of the lamp boards 11 in the backlight source 0010 are located in an area facing the first long side 143a, and part of the lamp boards 11 are located in an area facing the second side long edge 143b. A lamp board 11 facing the first long side 143a is electrically connected with a first connecting terminal 142 disposed on the first long side 143a. A lamp board 11 facing the second long side 143b is electrically connected with a first connecting terminal 142 disposed on the second long side 143b. In this way, two columns of first connecting terminals 142 can be disposed on two long sides of the adapter plate 14, so that more first connecting terminals 142 can be disposed on a single adapter plate 14, reducing a quantity of the adapter plates 14, and reducing the cost of the display apparatus.

In the Y direction, a distance between adjacent first connecting terminals 142 on the first long side 143a is A, and a distance between adjacent first connecting terminals 142 on the second long side 143b is B. Therefore, the lamp boards 11 facing the first long side 143a are arranged at equal intervals along the Y direction, and the lamp boards 11 facing the second long side 143b are arranged at equal intervals along the Y direction, so that light beams emitted from the backlight source 0010 are relatively uniform, and the image display quality of the display apparatus can be improved. For example, a width of the lamp board 11 is A', and the distance A and the distance B are both greater than the width A'. In this way, sufficient space can be reserved between adjacent first connecting terminals 142 for placing the lamp board 111, so that a utilization rate of the first connecting terminals can be improved.

A=B can be set in embodiments of the present disclosure, which can further improve uniformity of the light beam emitted from the backlight source 0010, improving the display quality of the display apparatus.

It should be noted that, embodiment shown in FIG. 28 only illustrates a quantity of first connecting terminals disposed on two long sides of the adapter plate. In practical application, the quantity of the first connecting terminals disposed on the two long sides of the adapter plate can be flexibly set, which is limited in embodiments of the present disclosure. It should also be noted that, in embodiments shown in FIG. 28, quantities of first connecting terminals disposed on the two long sides of the adapter plate are the same for illustration. In practical applications, quantities of first connecting terminals on the two long sides of the adapter plate may be the same or different, which is limited in embodiments of the present disclosure.

In the embodiments, on one hand, a plurality of first connecting terminals are disposed on two long sides of the adapter plate, and lamp boards are disposed in areas facing the two long sides of the adapter plate, so that more first connecting terminals can be disposed on a single adapter plate, and the cost of the display apparatus is reduced. On the other hand, distances between adjacent first connecting terminals can be equal along the long-side direction of the adapter plate, so that light beams emitted from the backlight source are relatively uniform, and the display quality of the display apparatus can be improved. In another aspect, the distance between adjacent first connecting terminals is not less than the width of the lamp board, so that sufficient space can be reserved between the adjacent first connecting terminals for placing the lamp board, and the utilization rate of the first connecting terminals is improved.

Figure 29:
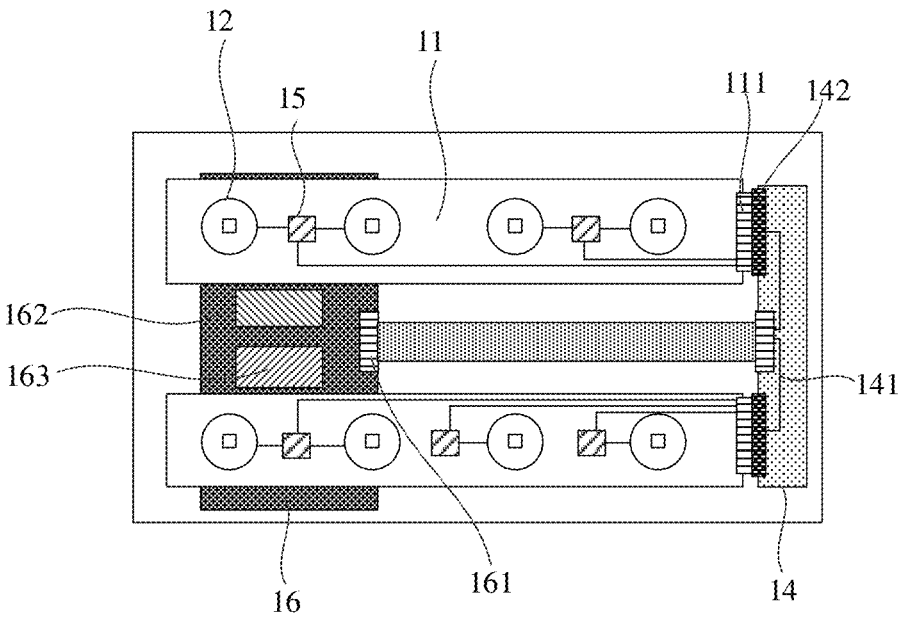
FIG. 29 is a schematic structural diagram of a backlight source according to embodiments of the present disclosure.

FIG. 29 is a schematic structural diagram of a backlight source according to embodiments of the present disclosure. As shown in FIG. 29, on the basis of the embodiment shown in FIG. 25, in embodiments of the present disclosure, the backlight source 0010 further includes a first circuit board 16 on a side of the lamp board 11 away from the light-emitting unit 12.

The first circuit board 16 includes a third connecting terminal 161, and a power supply module 162 and a controller 163 are disposed on the first circuit board 16. The controller 163 is electrically connected with a control signal line 141 through the third connecting terminal 161, and the controller 163 is also electrically connected with a main board or a timing controller.

For example, the first circuit board 16 may be a control board on which a controller 163 and a power supply module 162 are disposed, as shown in FIG. 29. There is no need to dispose an additional power board for the power supply module 162, so that the control board and the power board can be combined into one. A quantity of circuit boards is reduced, so that complexity of a hardware structure of the display apparatus can be reduced, and the cost of the display apparatus can be reduced. In addition, space occupied by the backlight source can be reduced, so that there is sufficient space for other functional modules, which is beneficial to multifunctional development of the display apparatus.

In other embodiments, the first circuit board 16 may be a power board on which a power supply module 162 and a controller 163 are disposed, as shown in FIG. 29. There is no need to provide an additional control board for the controller 163, so that the control board and the power board can be combined into one. A quantity of circuit boards is reduced, so that complexity of a hardware structure of the display apparatus can be reduced, and the cost of the display apparatus can be reduced. In addition, space occupied by the backlight source can be reduced, so that there is sufficient space for other functional modules, which is beneficial to multifunctional development of the display apparatus.

The power supply module 162 on the first circuit board 16 is electrically connected with the controller 163, and the power supply module 162 can provide power for the controller 163. The controller 163 may be electrically connected with the main board or the timing controller through an area control data line. In this way, the controller 163 may receive area control data sent from the main board or the timing controller. The first circuit board 16 includes a third connecting terminal, and a connecting terminal adapted to the third connecting terminal 161 may be disposed on the adapter plate 14. The adapted connecting terminal is electrically connected with a control signal line 141. In this way, the controller 163 can be electrically connected with the control signal line 141 through the third connecting terminal 161 and the connecting terminal adapted to the third connecting terminal 161.

A light-emitting unit 12 is disposed on a first surface of the lamp board 11, a second surface of the lamp board 11 is opposite to the first surface, and the first circuit board 16 is disposed in a side area facing the second surface. In this way, the first circuit board 16 may be disposed on a side of the lamp board 11 away from the light-emitting unit 12. Therefore, when the light-emitting unit 12 emits a light beam, the first circuit board 16 does not shield the light beam, so that uniformity of the light beam emitted from the backlight source 0010 can be improved, ensuring the image display quality of the display apparatus.

In the embodiments, on one hand, the first circuit board is located on a side of the lamp board away from the light-emitting unit, so that the first circuit board does not shield the light beam emitted from the backlight source and uniformity of the light beam emitted from the backlight source can be improved, ensuring the image display quality of the display apparatus. On the other hand, the first circuit board includes a third connecting terminal, a power supply module and a controller are disposed on the first circuit board, and the controller is electrically connected with a control signal line through a third connecting terminal and is also electrically connected with a main board or a timing controller. The control board and the power board can be combined into one, and circuit boards do not need to be respectively disposed for the power supply module and the controller. Therefore, a quantity of circuit boards can be reduced, a circuit of the backlight source can be simplified, complexity of a hardware structure of the display apparatus can be reduced and the cost of the display apparatus can be reduced. In addition, space occupied by the backlight source can be reduced, so that there is sufficient space for other functional modules, which is beneficial to multifunctional development of the display apparatus.

Figure 30:
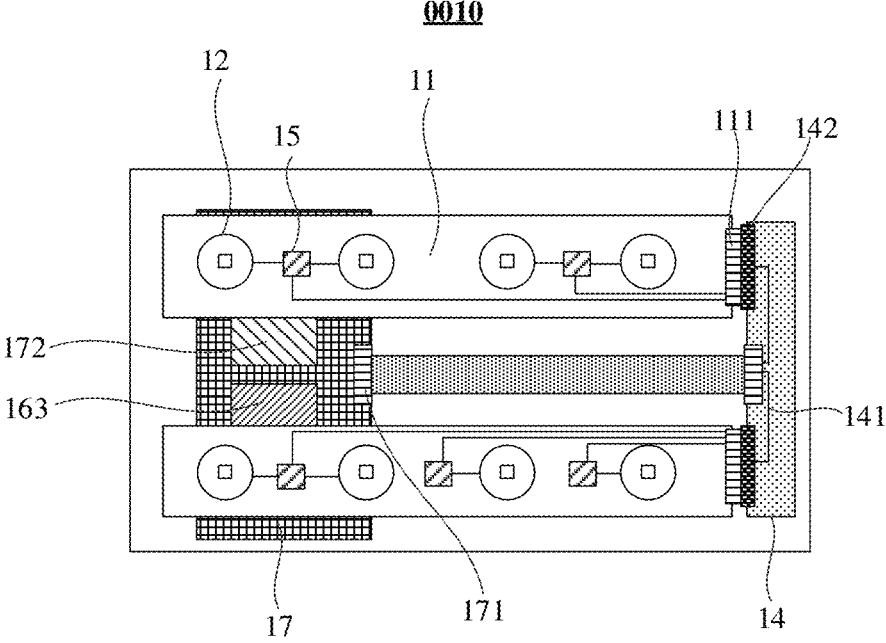
FIG. 30 is a schematic structural diagram of a backlight source according to embodiments of the present disclosure.

FIG. 30 is a schematic structural diagram of a backlight source according to embodiments of the present disclosure. As shown in FIG. 30, on the basis of the embodiment shown in FIG. 25, in embodiments of the present disclosure, the backlight source 0010 further includes a second circuit board 17 located on a side of the lamp board 11 away from the light-emitting unit 12.

The second circuit board 17 includes a fourth connecting terminal 171, and a controller 163 and a timing controller 172 are disposed on the second circuit board 17. The timing controller 172 is electrically connected with a control signal line 141 through the fourth connecting terminal 171, and the timing controller 172 is also electrically connected with a main board.

The second circuit board 17 may be a timing control board on which a controller 163 and a timing controller 172 are disposed, as shown in FIG. 30. There is no need to provide an additional control board for the controller 163, so that the control board and the timing control board can be combined into one. A quantity of circuit boards is reduced, so that complexity of a hardware structure of the display apparatus can be reduced, and the cost of the display apparatus can be reduced. In addition, space occupied by the backlight source can be reduced, so that there is sufficient space for other functional modules, which is beneficial to multifunctional development of the display apparatus.

In other embodiments, the second circuit board 17 may be a control board on which a controller 163 and a timing controller 172 are disposed, as shown in FIG. 30. There is no need to provide an additional timing control board for the timing controller 172, so that the control board and the timing control board can be combined into one. A quantity of circuit boards is reduced, so that complexity of a hardware structure of the display apparatus can be reduced, and the cost of the display apparatus can be reduced. In addition, space occupied by the backlight source can be reduced, so that there is sufficient space for other functional modules, which is beneficial to multifunctional development of the display apparatus.

The timing controller 172 on the second circuit board 17 is electrically connected with the controller 163, and the timing controller 172 transmits a timing control signal to the controller 163. The timing controller 172 is electrically connected with the main board, and can receive area control data and a power signal sent from the main board. The second circuit board 17 includes a fourth connecting terminal 171, and a connecting terminal adapted to the fourth connecting terminal 171 may be disposed on the adapter plate 14. The adapted connecting terminal is electrically connected with a control signal line 141, so that the timing controller 172 can be electrically connected with the control signal line 141 through the fourth connecting terminal 171 and the connecting terminal adapted to the fourth connecting terminals 171.

A light-emitting unit 12 is disposed on a first surface of the lamp board 11, a second surface of the lamp board 11 is opposite to the first surface, and the second circuit board 17 is disposed in a side area facing the second surface. In this way, the second circuit board 17 may be disposed on a side of the lamp board 11 away from the light-emitting unit 12. Therefore, when the light-emitting unit 12 emits a light beam, the second circuit board 17 does not shield the light beams, so that uniformity of the light beam emitted from the backlight source 0010 can be improved, ensuring the image display quality of the display apparatus.

In the embodiments, on one hand, the second circuit board is located on a side of the lamp board away from the light-emitting unit, so that second circuit board does not shield the light beam emitted from the backlight source and uniformity of the light beam emitted from the backlight source can be improved, ensuring the image display quality of the display apparatus. On the other hand, the second circuit board includes a fourth connecting terminal, a controller and a timing controller are disposed on the second circuit board, and the timing controller is electrically connected with a control signal line through a fourth connecting terminal and is also electrically connected with a main board. The control board and the timing control board can be combined into one, and circuit boards do not need to be respectively disposed for the controller and the timing controller. Therefore, a quantity of circuit boards can be reduced, a circuit of the backlight source can be simplified, complexity of a hardware structure of the display apparatus can be reduced and the cost of the display apparatus can be reduced. In addition, space occupied by the backlight source can be reduced, so that there is sufficient space for other functional modules, which is beneficial to multifunctional development of the display apparatus.

The present disclosure further provides a backlight module, including the backlight source 0010 according to any of the above embodiments.

Figure 31:
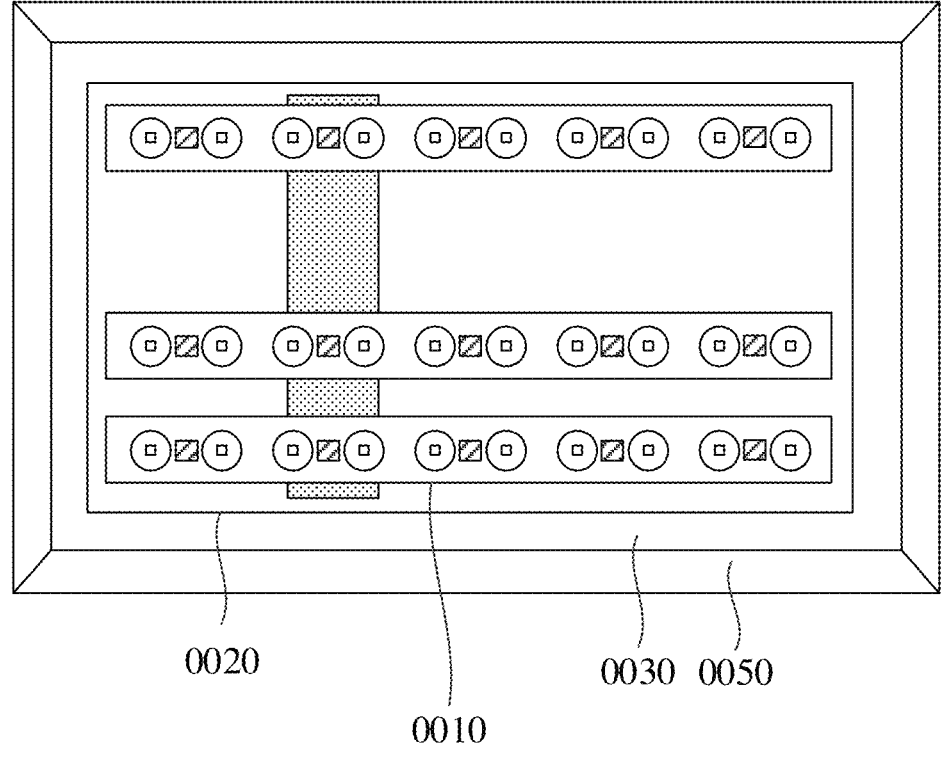
FIG. 31 is a schematic structural diagram of a backlight module according to embodiments of the present disclosure.

FIG. 31 is a schematic structural diagram of a backlight module according to embodiments of the present disclosure. As shown in FIG. 31, the backlight module includes a backlight source 0010, an optical film 0020 and a backplane 0030. The optical film 0020 is located on a side of the backplane 0030, and the backlight source 0010 is located on a side of the optical film 0020 away from the backplane 0030.

The backlight source 0010 in the embodiments may be a backlight source 0010 according to any of the above embodiments of the present disclosure. For example, as shown in FIGS. 25 and 26, the backlight source 0010 includes a lamp board 11, a plurality of driving units 15, and an adapter plate 14. A plurality of light-emitting units 12 are disposed on the lamp board 11, and all light-emitting units 12 on the lamp board 11 belong to a plurality of light-emitting areas. A first end of a driving unit 15 is electrically connected with at least part of the light-emitting units 12 in the same light-emitting area. The adapter plate 14 includes a control signal line 141, and the control signal line 141 is electrically connected with a second end of the driving unit 15. The driving unit 15 may be disposed on the lamp board 11 as shown in FIG. 25, or may be disposed on the adapter plate 14 as shown in FIG. 26.

In embodiments of the present disclosure, as shown in FIG. 31, the backlight module further includes a side plate 0050, and the side plate 0050 is connected with an edge of the backplane 0030 to form a chamber, the backlight source 0010 is placed in the chamber, and the side plate 0050 plays a role of support and protection.

It should be understood that the present disclosure is not limited to precise arrangements that have been described above and illustrated in the accompanying drawings, and various modifications and changes may be made without departing from the scope of the present disclosure. The scope of the present disclosure is limited only by appended claims.

What is claimed is:

1. A display apparatus, comprising:
   a lamp board, comprising a plurality of light-emitting units, wherein the plurality of light-emitting units on the lamp board are divided into a plurality of light-emitting areas;
   a plurality of driving units disposed on the lamp board, wherein a first end of one of the plurality of the driving units is electrically connected with some of the light-emitting units in the same light-emitting area; and
   an adapter plate, comprising a plurality of control signal lines, wherein one of the plurality of the control signal lines is electrically connected with a second end of the one of the plurality of the driving units;
   wherein a first connecting terminal is disposed on the adapter plate, and a second connecting terminal is disposed on the lamp board;
   the first connecting terminal is electrically connected with the second end of the one of the plurality of driving units, the second connecting terminal is electrically connected with one of the plurality of control signal lines, and the first connecting terminal is electrically connected with the second connecting terminal.

2. The display apparatus according to claim 1, wherein the display apparatus comprises a plurality of adapter plates, and short sides of adjacent adapter plates are disposed opposite to each other.

3. The display apparatus according to claim 1, wherein the display apparatus comprises a plurality of lamp boards arranged along a long-side direction of the adapter plate.

4. The display apparatus according to claim 3, wherein the second connecting terminal is disposed on a side of one of the lamp boards close to the adapter plate.

5. The display apparatus according to claim 1, wherein a plurality of first connecting terminals are disposed on two long sides of the adapter plate.

6. The display apparatus according to claim 5, wherein along a long-side direction of the adapter plate, distances between adjacent first connecting terminals are equal.

7. The display apparatus according to claim 5, wherein a distance between adjacent first connecting terminals is not less than a width of the lamp board.

8. The display apparatus according to claim 3, wherein the plurality of lamp boards are disposed in areas facing long sides of the adapter plate.

9. The display apparatus according to claim 1, further comprising:
   a first circuit board, wherein the first circuit board comprises a third connecting terminal, a first controller is disposed on the first circuit board, the first controller is electrically connected with the control signal line through the third connecting terminal, and the first controller is further electrically connected with a main board.

10. The display apparatus according to claim 1, further comprising:
    a first circuit board, wherein the first circuit board comprises a third connecting terminal, a first controller is disposed on the first circuit board, the first controller is electrically connected with the control signal line through the third connecting terminal, and the first controller is further electrically connected with a timing controller.

11. The display apparatus according to claim 9, wherein the first circuit board is a control board.

12. The display apparatus according to claim 9, wherein a power supply module is further disposed on the first circuit board, and the power supply module is configured to provide power for the first controller.

13. The display apparatus according to claim 12, wherein the first circuit board is a power board.

14. The display apparatus according to claim 1, further comprising:
    a second circuit board, wherein the second circuit board comprises a fourth connecting terminal, a timing controller is disposed on the second circuit board, the timing controller is electrically connected with a control signal line through the fourth connecting terminal, and the timing controller is further electrically connected with a main board.

15. The display apparatus according to claim 14, wherein the second circuit board is a timing control board.

16. The display apparatus according to claim 14, wherein a second controller is disposed on the second circuit board, the second controller is electrically connected with the timing controller, and the timing controller is configured to transmit a timing control signal to the second controller.

17. The display apparatus according to claim 14, wherein the second circuit board is a control board.

18. The display apparatus according to claim 1, wherein the lamp board is a lamp bar.

19. A display apparatus, comprising:
    a lamp board, comprising a plurality of light-emitting units, wherein the plurality of light-emitting units on the lamp board are divided into a plurality of light-emitting areas;

a plurality of driving units disposed on the lamp board, wherein a first end of one of the plurality of the driving units is electrically connected with some of the light-emitting units in the same light-emitting area; and an adapter plate, comprising a plurality of control signal lines, wherein one of the plurality of the control signal lines is electrically connected with a second end of the one of the plurality of the driving units;

wherein a power signal line configured to transmit a power signal is further disposed on the adapter plate.

20. The display apparatus according to claim 19, wherein a first connecting terminal is disposed on the adapter plate, and a second connecting terminal is disposed on the lamp board;

the first connecting terminal is electrically connected with the second end of the one of the plurality of driving units, the second connecting terminal is electrically connected with one of the plurality of control signal lines, and the first connecting terminal is electrically connected with the second connecting terminal.

21. The display apparatus according to claim 19, wherein the display apparatus comprises a plurality of adapter plates, and short sides of adjacent adapter plates are disposed opposite to each other.

22. The display apparatus according to claim 20, wherein the display apparatus comprises a plurality of lamp boards arranged along a long-side direction of the adapter plate.

23. The display apparatus according to claim 22, wherein the second connecting terminal is disposed on a side of one of the lamp boards close to the adapter plate.

24. The display apparatus according to claim 20, wherein a plurality of first connecting terminals are disposed on two long sides of the adapter plate.

25. The display apparatus according to claim 24, wherein along a long-side direction of the adapter plate, distances between adjacent first connecting terminals are equal.

26. The display apparatus according to claim 24, wherein a distance between adjacent first connecting terminals is not less than a width of the lamp board.

27. The display apparatus according to claim 22, wherein the plurality of lamp boards are disposed in areas facing long sides of the adapter plate.

28. The display apparatus according to claim 20, further comprising:

a first circuit board, wherein the first circuit board comprises a third connecting terminal, a first controller is disposed on the first circuit board, the first controller is electrically connected with the control signal line through the third connecting terminal, and the first controller is further electrically connected with a main board.

29. The display apparatus according to claim 20, further comprising:

a first circuit board, wherein the first circuit board comprises a third connecting terminal, a first controller is disposed on the first circuit board, the first controller is electrically connected with the control signal line through the third connecting terminal, and the first controller is further electrically connected with a timing controller.

30. The display apparatus according to claim 28, wherein the first circuit board is a control board.

31. The display apparatus according to claim 28, wherein a power supply module is further disposed on the first circuit board, and the power supply module is configured to provide power for the first controller.

32. The display apparatus according to claim 31, wherein the first circuit board is a power board.

33. The display apparatus according to claim 20, further comprising:

a second circuit board, wherein the second circuit board comprises a fourth connecting terminal, a timing controller is disposed on the second circuit board, the timing controller is electrically connected with a control signal line through the fourth connecting terminal, and the timing controller is further electrically connected with a main board.

34. The display apparatus according to claim 33, wherein the second circuit board is a timing control board.

35. The display apparatus according to claim 33, wherein a second controller is disposed on the second circuit board, the second controller is electrically connected with the timing controller, and the timing controller is configured to transmit a timing control signal to the second controller.

36. The display apparatus according to claim 33, wherein the second circuit board is a control board.

37. The display apparatus according to claim 19, wherein the lamp board is a lamp bar.

* * * * *